United States Patent
Ko et al.

(10) Patent No.: US 9,543,357 B2
(45) Date of Patent: Jan. 10, 2017

(54) MAGNETORESISTIVE RANDOM ACCESS MEMORY DEVICES AND METHODS OF MANUFACTURING THE SAME

(71) Applicants: Seung-Pil Ko, Hwaseong-si (KR); Myoung-Su Son, Hwaseong-si (KR); Kil-Ho Lee, Hwaseong-si (KR)

(72) Inventors: Seung-Pil Ko, Hwaseong-si (KR); Myoung-Su Son, Hwaseong-si (KR); Kil-Ho Lee, Hwaseong-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 14/804,321

(22) Filed: Jul. 20, 2015

(65) Prior Publication Data
US 2016/0020249 A1   Jan. 21, 2016

(30) Foreign Application Priority Data
Jul. 21, 2014   (KR) .................. 10-2014-0091885

(51) Int. Cl.
| | |
|---|---|
| *H01L 27/22* | (2006.01) |
| *H01L 43/08* | (2006.01) |
| *H01L 43/02* | (2006.01) |
| *H01L 43/12* | (2006.01) |

(52) U.S. Cl.
CPC .......... *H01L 27/222* (2013.01); *H01L 27/228* (2013.01); *H01L 43/02* (2013.01); *H01L 43/08* (2013.01); *H01L 43/12* (2013.01)

(58) Field of Classification Search
CPC ........ H01L 27/222; H01L 43/12; H01L 43/02; H01L 43/08
USPC .................................. 257/427; 438/3
See application file for complete search history.

(56) References Cited

U.S. PATENT DOCUMENTS

| | | | |
|---|---|---|---|
| 6,350,649 | B1 | 2/2002 | Jeong et al. |
| 7,042,035 | B2 | 5/2006 | Rinerson et al. |
| 7,541,199 | B2 | 6/2009 | Bae et al. |
| 7,755,153 | B2 | 7/2010 | Ho et al. |
| 7,767,469 | B2 | 8/2010 | Asao et al. |

(Continued)

FOREIGN PATENT DOCUMENTS

| | | |
|---|---|---|
| JP | 2008535220 A | 8/2006 |
| JP | 4719208 B2 | 4/2011 |

(Continued)

*Primary Examiner* — Yasser A Abdelaziez
(74) *Attorney, Agent, or Firm* — Renaissance IP Law Group LLP

(57) ABSTRACT

An MRAM device comprises an insulating interlayer comprising a flat first upper surface on a first region and a second region of a substrate. A pattern structure comprising pillar-shaped magnetic tunnel junction (MTJ) structures and a filling layer pattern between the MTJ structures is formed on the insulating interlayer of the first region. The pattern structure comprises a flat second upper surface that is higher than the first upper surface. Bit lines are formed on the pattern structure that contact top surfaces of the MTJ structures. An etch-stop layer is formed on the pattern structure between the bit lines of the first region and the first upper surface of the first insulating interlayer of the second region. A first portion of an upper surface of the etch-stop layer on the first region is higher than a second portion of the upper surface of the etch-stop layer on the second region.

19 Claims, 25 Drawing Sheets

(56) References Cited

U.S. PATENT DOCUMENTS

| | | |
|---|---|---|
| 7,884,433 B2 | 2/2011 | Zhong et al. |
| 2004/0165427 A1 | 8/2004 | Jeong |
| 2004/0253811 A1 | 12/2004 | Lee et al. |
| 2005/0174876 A1* | 8/2005 | Katoh .............. B82Y 10/00 365/232 |
| 2009/0224300 A1 | 9/2009 | Yamagishi et al. |
| 2011/0306177 A1 | 12/2011 | Dunton et al. |
| 2013/0104607 A1 | 5/2013 | Broitzman |
| 2013/0170281 A1 | 7/2013 | Song et al. |

FOREIGN PATENT DOCUMENTS

| | | |
|---|---|---|
| JP | 4835614 B2 | 10/2011 |
| JP | 2013065756 A | 4/2013 |
| KR | 0481876 B1 | 3/2005 |
| KR | 0587635 B1 | 5/2006 |
| KR | 20060068595 A | 6/2006 |
| KR | 20130077374 A | 7/2013 |
| KR | 20140019563 A | 2/2014 |

* cited by examiner

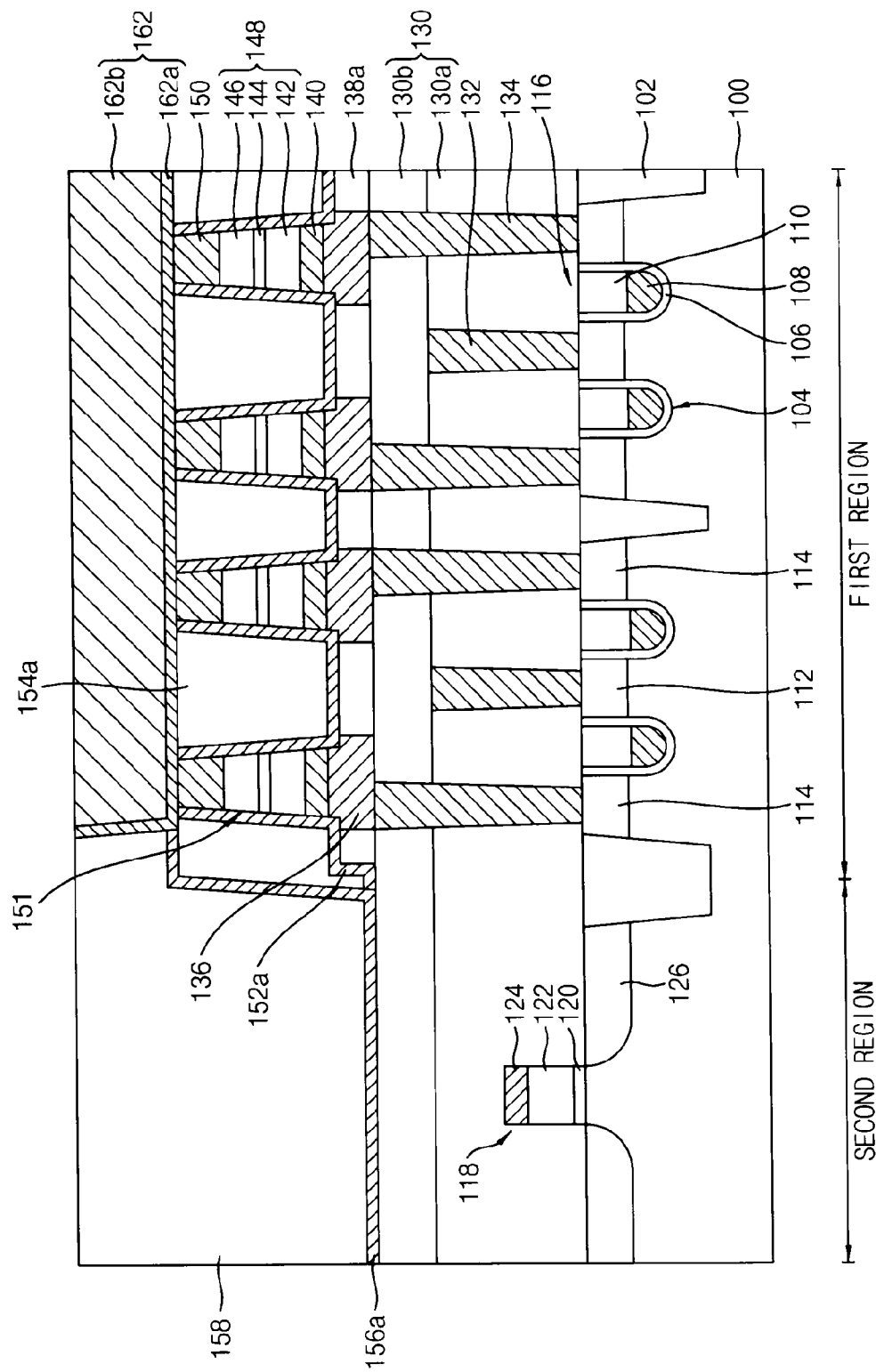

FIG. 1C
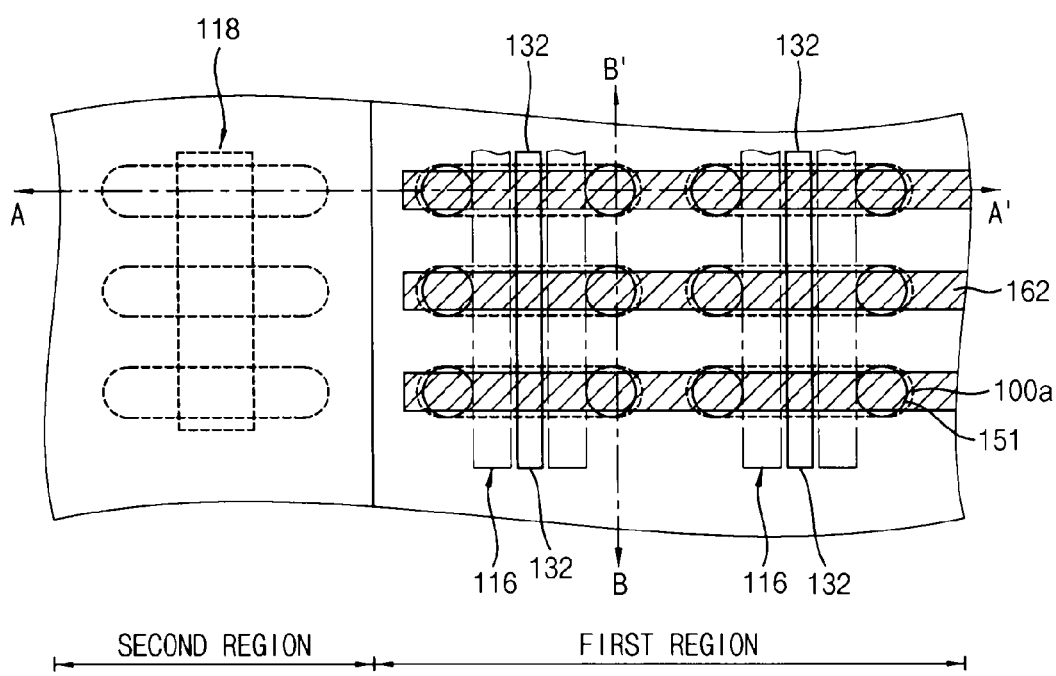
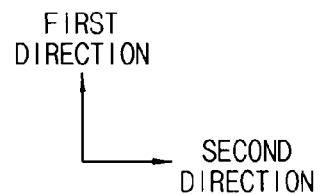

MAGNETORESISTIVE RANDOM ACCESS MEMORY DEVICES AND METHODS OF MANUFACTURING THE SAME

CROSS-REFERENCE TO RELATED APPLICATION

This application claims priority under 35 U.S.C. §119 to Korean Patent Application No. 10-2014-0091885, filed on Jul. 21, 2014, in the Korean Intellectual Property Office (KIPO), the contents of which are herein incorporated by reference in their entirety.

BACKGROUND

Example embodiments relate to semiconductor memory devices and methods of manufacturing the same. More particularly, example embodiments relate to magnetoresistive random access memory (MRAM) devices and methods of manufacturing the same.

An MRAM device may include a plurality of magnetic tunnel junction (MTJ) structures and bit lines electrically connected to the MTJ structures. Thus, methods of forming the MTJ structures and the bit lines with no damage caused thereto during fabrication may be needed.

SUMMARY

Example embodiments provide an MRAM device having no contact failures.

Example embodiments provide a method of manufacturing the MRAM device.

According to example embodiments, there is provided an MRAM device. The MRAM device may include a first insulating interlayer, a pattern structure, bit lines and an etch-stop layer. The first insulating interlayer comprises a flat first upper surface is formed on a first region and a second region of a substrate. A pattern structure comprising pillar-shaped magnetic tunnel junction (MTJ) structures and a filling layer pattern between the MTJ structures is formed on the first insulating interlayer of the first region. The pattern structure comprises a flat second upper surface that is higher than the first upper surface. The bit lines are formed on the pattern structure, and each of the bit lines contact top surfaces of the MTJ structures. The etch-stop layer is formed on the pattern structure between the bit lines of the first region and the first upper surface of the first insulating interlayer of the second region, and a first portion of an upper surface of the etch-stop layer on the first region is higher than a second portion of the upper surface of the etch-stop layer on the second region.

In example embodiments, the MRAM device may further comprise a capping layer pattern on a sidewall of each of the MTJ structures and the first insulating interlayer between the MTJ structures on the first region.

In example embodiments, the capping layer pattern may comprise silicon nitride or silicon oxynitride.

In example embodiments, the etch-stop layer may be formed on the entire first upper surface of the first insulating interlayer on the second region, a sidewall of the filling layer at an interface between the first and second regions, and a portion of an upper surface of the filling layer.

In example embodiments, the etch-stop layer may comprise silicon nitride, silicon oxynitride or aluminum oxide.

In example embodiments, the MRAM device may further comprise a second insulating interlayer on the etch-stop layer of the first and second regions, and the second insulating interlayer may fill gaps between the bit lines.

In example embodiments, a thickness of a portion of the second insulating interlayer on the first region is smaller than at thickness of a portion of the second insulating interlayer on the second region.

In example embodiments, a portion of an upper surface of the second insulating interlayer on the first region is substantially coplanar with a portion of the upper surface of the second insulating interlayer on the second region.

In example embodiments, the MRAM device is part of a computing device, such as, but not limited to, a personal digital assistant (PDA), a laptop computer, a mobile computer, a web tablet, a wireless phone, a cell phone, a smart phone, a digital music player, or a wireline or wireless electronic device. In example embodiments, the computing device comprises a touch-screen display.

In example embodiments, the MRAM device may further comprise a plurality of contact plugs extending through the first insulating interlayer, and the contact plugs may be electrically connected to the MTJ structures and the first region of the substrate.

In example embodiments, the MRAM device may further include a plurality of pad patterns in which a pad pattern is on a respective contact plug, and the pad patterns electrically connect the MTJ structures to the contact plugs, respectively.

According to example embodiments, there is provided an MRAM device. The MRAM device may comprise a lower structure, a plurality of magnetic tunnel junction (MTJ) structures, a capping layer pattern, a filling layer pattern, bit lines and an etch-stop layer. The lower structure comprising a flat first upper surface that is formed on a substrate. The MTJ structures comprise a pillar shape and are formed on the lower structure. The capping layer pattern is formed on a sidewall of each of the MTJ structures and the lower structure between the MTJ structures. The filling layer pattern is formed on the capping layer pattern, and the filling layer fills gaps between the MTJ structures, and a top surface of the filling layer is substantially coplanar with top surfaces of the MTJ structures. The bit lines are formed on the filling layer pattern and the MTJ structures, and each of the bit lines contacts the top surfaces of the MTJ structures. The etch-stop layer is formed on the filling layer pattern between the bit lines.

In example embodiments, the etch-stop layer may comprise a flat upper surface.

In example embodiments, the etch-stop layer may comprise silicon nitride, silicon oxynitride or aluminum oxide.

In example embodiments, the capping layer pattern may comprise silicon nitride or silicon oxynitride.

In example embodiments, the MRAM device may further comprise a second insulating interlayer on the etch-stop layer, and the second insulating interlayer may fill gaps between the bit lines.

In example embodiments, the MRAM device is part of a computing device, such as, but not limited to, a personal digital assistant (PDA), a laptop computer, a mobile computer, a web tablet, a wireless phone, a cell phone, a smart phone, a digital music player, or a wireline or wireless electronic device. In example embodiments, the computing device comprises a touch-screen display.

According to example embodiments, there is provided a method of manufacturing an MRAM device. In the method, a first insulating interlayer may be formed to have a flat first upper surface on a first region and a second region of a substrate. A pattern structure is formed on the first insulating interlayer of the first region. The pattern structure comprises magnetic tunnel junction (MTJ) structures and a filling layer pattern between the MTJ structures. The pattern structure is formed to have a flat second upper surface higher than the first upper surface, and the MTJ structures are formed to comprise a pillar shape. A preliminary etch-stop layer is formed on the first insulating interlayer of the second region and the pattern structure of the first region. A second insulating interlayer is formed on the preliminary etch-stop layer to comprise a flat upper surface. The second insulating interlayer and the preliminary etch-stop layer on the first region are partially etched to form openings exposing upper surfaces of the MTJ structures, respectively, and the preliminary etch-stop layer is converted into an etch-stop layer, and a portion of an upper surface of the etch-stop layer on the first region is higher than a portion of the upper surface of the etch-stop layer on the second region. Bit lines are formed in the opening.

In example embodiments, a capping layer pattern may be further formed on a sidewall of each of the MTJ structures and the lower structure between the MTJ structures.

In example embodiments, when the pattern structure is formed on the substrate, a filling layer may be formed on the capping layer to fill gaps between the MTJ structures. The filling layer may be etched using a portion of the capping layer on the second region as an etch-stop detecting layer until a portion of the capping layer on the MTJ structures is exposed. Portions of the capping layer on the first insulating interlayer of the second region and on the MTJ structures may be removed to form the capping layer pattern.

In example embodiments, the preliminary etch-stop layer may be conformally formed on the first upper surface of the first insulating interlayer on the second region, the second upper surface of the pattern structure, and a sidewall of the pattern structure at an interface between the first and second regions.

In example embodiments, the preliminary etch-stop layer on the first and second region may be formed to comprise a flat upper surface, and a portion of the upper surface of the preliminary etch-stop layer on the first region may be higher than a portion of the upper surface of the preliminary etch-stop layer on the second region.

According to example embodiments, the MRAM device may include an etch-stop layer so that damages of the MTJ structures may be reduced during an etching process for forming the bit lines. Also, a contact failure between each of the MTJ structures and each of the bit lines may be reduced. Thus, a variation of a resistance between each of the MTJ structures and each of the bit lines may decrease so that the MRAM device may have good operational characteristics.

In example embodiments, the MRAM device is part of a computing device, such as, but not limited to, a personal digital assistant (PDA), a laptop computer, a mobile computer, a web tablet, a wireless phone, a cell phone, a smart phone, a digital music player, or a wireline or wireless electronic device. In example embodiments, the computing device comprises a touch-screen display.

BRIEF DESCRIPTION OF THE DRAWINGS

Example embodiments will be more clearly understood from the following detailed description taken in conjunction with the accompanying drawings. FIGS. 1 to 22 represent non-limiting, example embodiments as described herein.

FIGS. 1A, 1B and 1C are cross-sectional views and a plan view of an MRAM device in accordance with example embodiments;

FIGS. 2 to 16 are cross-sectional views illustrating stages of a method of manufacturing the MRAM device of FIGS. 1A, 1B and 1C;

FIG. 17 is cross-sectional view an MRAM device in accordance with example embodiments;

FIGS. 18 to 21 are cross-sectional views illustrating stages of a method of manufacturing the MRAM device of FIG. 17;

FIG. 22 is a block diagram illustrating stages a memory system in accordance with example embodiments;

DESCRIPTION OF EMBODIMENTS

Figure 1B:
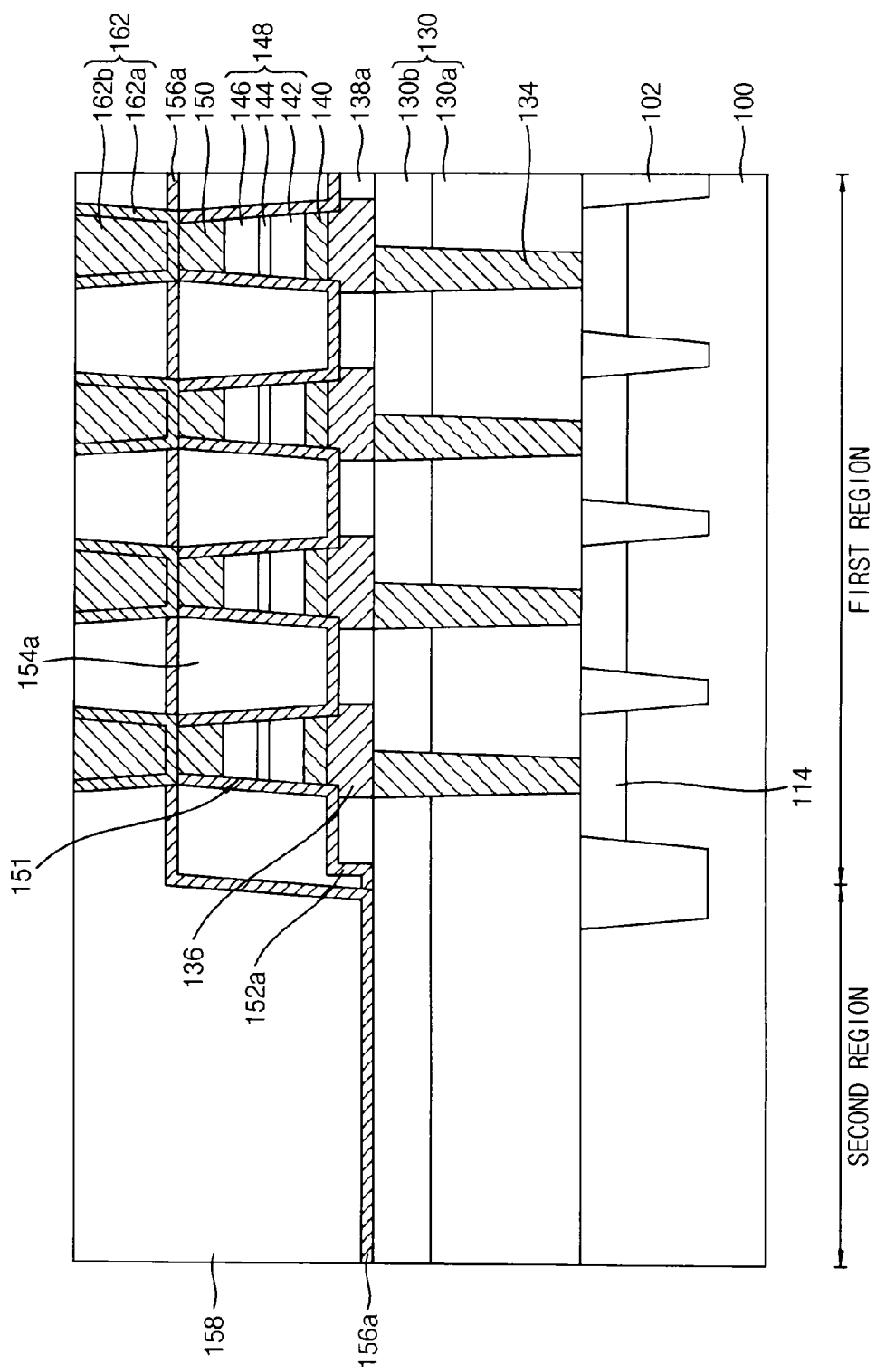

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 1B and 1C are cross-sectional views and a plan view of an MRAM device in accordance with example embodiments. FIG. 1A is a cross-sectional view as viewed along a line A-A' of FIG. 1C, and FIG. 1B is a cross-sectional view as viewed along a line B-B' of FIG. 1C.

Referring to FIGS. 1A to 1C, the MRAM device may include a substrate 100 including a first region and a second region. The first region may be a cell region for forming magnetic memory cells, and the second region may be a peripheral circuit region for forming peripheral circuits. The substrate 100 may be a silicon substrate, a germanium substrate, a silicon-germanium substrate, a silicon-on-insulator (SOI) substrate, a germanium-on-insulator (GOI) substrate, etc.

The first and second regions of the substrate 100 may include an active region 100a and a field region.

In example embodiments, a plurality of active regions 100a having an island shape and separated from each other may be formed. First transistors 116 may be formed at each of the active regions 100a. In example embodiments, two first transistors 116 each of which may include a first gate structure may be formed at each of the active regions 100a. A center portion of each of the active regions 100a may serve as a first source region 112, and edge portions of each of the active regions 100a may serve as first drain regions 114. The first source region 112 may serve as a common source region of the two first transistors 116. The first transistors 116 may be buried channel array transistors (BCATs). Thus, the first gate structure may be formed in a trench of the substrate 100, and may include a first gate insulation pattern 106, a first gate electrode 108 and a first hard mask 110.

In other example embodiments, the first transistors may be planar-type channel array transistors (PCATs) each of which may include the first gate structure on the substrate 100.

The first gate structure may have a linear shape extending in a first direction.

A source line 132 may extend in the first direction on the first source region 112. The source line 132 may include a metal, e.g., tungsten, titanium, tantalum, etc., and/or a metal nitride, e.g., tungsten nitride, titanium nitride, tantalum nitride, etc.

A second transistor 118 may be formed in the second region of the substrate 100, and may form the peripheral circuits. The second transistor 118 may be a PCAT. The second transistor 118 may include a second gate insulation pattern 120, a second gate electrode 122 and second source/drain regions 126.

A first insulating interlayer 130 may be formed on the first and second regions of the substrate 100. The first insulating interlayer 130 may sufficiently cover the source line 132 and the first and second transistors 116 and 118. The first insulating interlayer 130 may have a first upper surface, which may be flat. Thus, the first upper surface of the first insulating interlayer 130 may be higher than that of the source line 132. In example embodiments, the first insulating interlayer 130 may include a first lower insulating interlayer 130a and a second lower insulating interlayer 130b. The source line 132 may be formed through the first lower insulating interlayer 130a.

Contact plugs 134 may contact the first drain regions 114 through the first insulating interlayer 130 of the first region. That is, the contact plugs 134 may be formed through the first and second lower insulating interlayers 130a and 130b. A top surface of each of the contact plugs 134 may be higher than that of the source line 132.

Pad patterns 136 may be formed on the contact plugs 134, respectively. Also, an insulation layer pattern 138a may be formed on the first insulating interlayer 130 between the pad patterns 136. The pad patterns 136 may electrically connect the contact plugs 134 and MTJ structures 151, respectively, when the contact plugs 134 and the MTJ structures 151 may not directly contact each other. In other example embodiments, no pad patterns may be formed when the contact plugs 134 and the MTJ structures 151 may directly contact each other.

The MTJ structures 151 may be respectively formed on the pad patterns 136. Each of the MTJ structures 151 may have a pillar shape, and may be formed regularly spaced apart from each other.

Each of the MTJ structures 151 may include a sequentially stacked lower electrode 140, an MTJ pattern 148 and an upper electrode 150. The MTJ pattern 148 may include a sequentially stacked fixed layer pattern 142, a tunnel barrier layer pattern 144, and a free layer pattern 146. The upper and lower electrodes 140 and 150 may include a metal and/or a metal nitride.

In example embodiments, the fixed layer pattern 142 may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, Cr, etc. A lower ferromagnetic layer (not shown), an anti-ferromagnetic coupling spacer layer (not shown) and an upper ferromagnetic layer (not shown) may be further formed on the fixed layer pattern 142. The lower and upper ferromagnetic layers may include, e.g., Fe, Ni, Co, etc. The anti-ferromagnetic coupling spacer layer may include, e.g., Ru, Ir, Rh, etc.

The tunnel barrier layer pattern 144 may include, e.g., aluminum oxide or magnesium oxide.

The free layer pattern 146 may include a ferromagnetic material containing, e.g., Fe, Ni, Co, etc.

The MTJ structures 151 may not be limited to the above composition, and other various modifications may be available.

A capping layer pattern 152a may be conformally formed on the insulation layer pattern 138a and sidewalls of the MTJ structures 151. Thus, the capping layer pattern 152a may be formed on a bottom and a sidewall of a gap between the MTJ structures 151. The capping layer pattern 152a may serve as a protective layer of the MTJ structures 151. The capping layer pattern 152a may not be formed on the second region of the substrate 100, but may be formed on the first region of the substrate 100.

The capping layer pattern 152a may include an insulating material. The insulating material of the capping layer pattern 152a may provide an etch ending-point detect signal during etching a silicon oxide layer. That is, in a plasma etching process, a light may be emitted from the capping layer pattern 152a including the insulating material, which may have a wavelength that is different from a wavelength of a light emitted from a silicon oxide layer. Also, the insulating material of the capping layer pattern 152a may have an etching selectivity with respect to a filling layer pattern 154a including silicon oxide, and may include, e.g., silicon nitride, silicon oxynitride, etc.

The filling layer pattern 154a may be formed on the capping layer pattern 152a to fill a remaining portion of the gap between the MTJ structures 151. The filling layer pattern 154a may not be formed on the second region of the substrate 100, but may be formed only on the first region of the substrate 100. Top surfaces of the filling layer pattern 154a and the MTJ structures 151 may be substantially coplanar with each other and flat, which may be referred to as a second upper surface. The filling layer pattern 154a may include an insulating material having a good step-coverage characteristic, so that the insulating material may be easily filled into the remaining portion of the gap between the MTJ structures 151. The filling layer pattern 154a may include silicon oxide which may be formed by an atomic layer deposition (ALD) process.

As described above, the filling layer pattern 154a and the MTJ structure 151 may not be formed on the first insulating interlayer 130 of the second region, but may be formed on the first insulating interlayer 130 of the first region. Thus, the first and second upper surfaces on the first and second regions may be different from each other.

A bit line 162 may be formed on the filling layer patterns 154a and the MTJ structures 151. The bit line 162 may contact the MTJ structures 151, and extend in a second direction substantially perpendicular to the first direction. In particular, the bit line 162 may contact the upper electrodes 150 of the MTJ structures 151. In example embodiments, a plurality of the bit lines 162 may be formed to be parallel to each other.

Each of the bit lines 162 may include a barrier layer pattern 162a and a metal layer pattern 162b substantially stacked. The barrier layer pattern 162a may include a metal, e.g., titanium, tantalum, etc., and/or a metal nitride, e.g., titanium nitride, tantalum nitride, etc. The metal layer pattern 162b may include, e.g., Cu, W, Al, etc.

An etch-stop layer 156a may be formed on the filling layer pattern 154a between the bit lines 162 on the first region and the first insulating interlayer 130 on the second region. Upper surfaces of the filling layer pattern 154a on the first region and the first insulating interlayer 130 on the second region may not be located at the same height, and an upper surface of the etch-stop layer 156a of the first region may be higher than an upper surface of the etch-stop layer 156a of the second region. The etch-stop layer 156a may have substantially the same thickness on the first and second regions.

The etch-stop layer 156a may be formed on the entire first upper surface of the first insulating interlayer 130 of the second region, a sidewall of the filling layer pattern 154a at an interface of the first and second regions, and a portion of the top surface of the filling layer pattern 154a. Thus, the etch-stop layer 156a may extend from the first upper surface of the first insulating interlayer 130 on the second region to the top surface of the filling layer pattern 154a on the first region, and may not end at the interface of the first and second regions.

The etch-stop layer 156a may include a material having an etching selectivity with respect to a material of a second insulating interlayer 158, e.g., silicon oxide. In example embodiments, the etch-stop layer 156a may be hardly etched during etching the second insulating interlayer 158 including silicon oxide. The etch-stop layer 156a may include, e.g., silicon nitride, silicon oxynitride, aluminum oxide, etc. In example embodiments, the etch-stop layer 156a may include a material substantially the same as that of the capping layer pattern 152a. Alternatively, the etch-stop layer 156a may include a material that is different from that of the capping layer pattern 152a.

The second insulating interlayer 158 may be formed on the etch-stop layer 156a of the first and second regions. The etch-stop layer 156a of the second region may be formed between the first and second interlayers 130 and 158. In example embodiments, an upper surface of the second insulating interlayer 158 may be substantially coplanar with upper surfaces of the bit lines 162.

Upper insulating interlayer (not shown) may be further formed on the second insulating interlayer 158 and the bit lines 162.

As described above, the MRAM device may include the etch-stop layer 156a on the filling layer pattern 154a between the MTJ structures 151. By performing an etching process using the etch-stop layer 156a, damages of the top surface of the MTJ structure 161 caused during fabrication may decrease. Also, a contact failure between the MTJ structures 151 and the bit lines 162 caused during fabrication may decrease. Thus, the MRAM device may have a reduced resistance distribution between each of the MTJ structures 151 and each of the bit lines 162.

FIGS. 2 to 16 are cross-sectional views of an MRAM device in accordance with example embodiments. FIGS. 2 to 13 and 15 are cross-sectional views as viewed along a line A-A' of FIG. 1C, and FIGS. 14 and 16 are cross-sectional views as viewed along a line B-B' of FIG. 1C.

Figure 2:
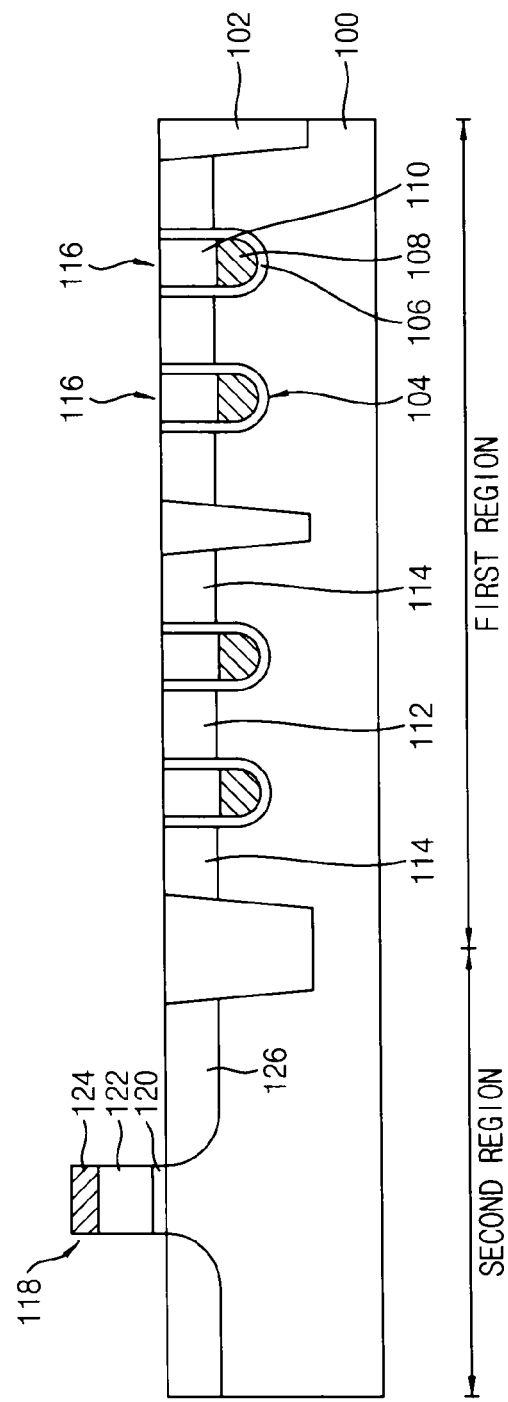

Referring to FIG. 2, an isolation layer 102 may be formed on a substrate 100 so that the substrate 100 may be divided into a field region on which the isolation layer 102 is formed and an active region on which no isolation layer is formed. The substrate 100 may include a first region in which memory cells may be formed and a second region in which peripheral circuits may be formed. The isolation layer 102 may be formed by a shallow trench isolation (STI) process. In example embodiments, a plurality of active regions having an island shape may be formed in a regular pattern separated from each other by isolation layers 102.

First transistors 116 may be formed on the first region of the substrate 100. Two first transistors 116 may be formed within each of the active regions. In example embodiments, the first transistors 116 may be BCATs. Particularly, a mask (not shown) may be formed on the substrate 100, and an upper portion of the substrate 100 may be etched using the mask as an etching mask to form trenches 104 extending in a first direction. Two trenches 104 may be formed within each of the active regions. A first gate structure may be formed in each of the trenches 104, and the first gate structure may include a first gate insulation pattern 106, a first gate electrode 108 and a first hard mask 110. The active region adjacent to the first gate structure may be doped with impurities to form a first source region 112 and first drain regions 114. The first source region 112 may serve as a common source region of the two first transistors 116 within each of the active regions.

The first transistors 116 may not be limited to the BCATs, but may be PCATs.

A second transistor 118 may be formed on the second region of the substrate 100. In example embodiments, the second transistor 118 may be a PCAT. Particularly, a gate insulation layer, a gate electrode layer and a second hard mask 124 may be sequentially formed on the substrate 100, and the gate electrode layer and a gate insulation layer may be etched using the second hard mask 124 as an etching mask to form a second gate electrode 122 and a second gate insulation pattern 120, respectively. The active region adjacent to the second gate electrode 122 may be doped with impurities to form second source/drain regions 126.

Figure 3:
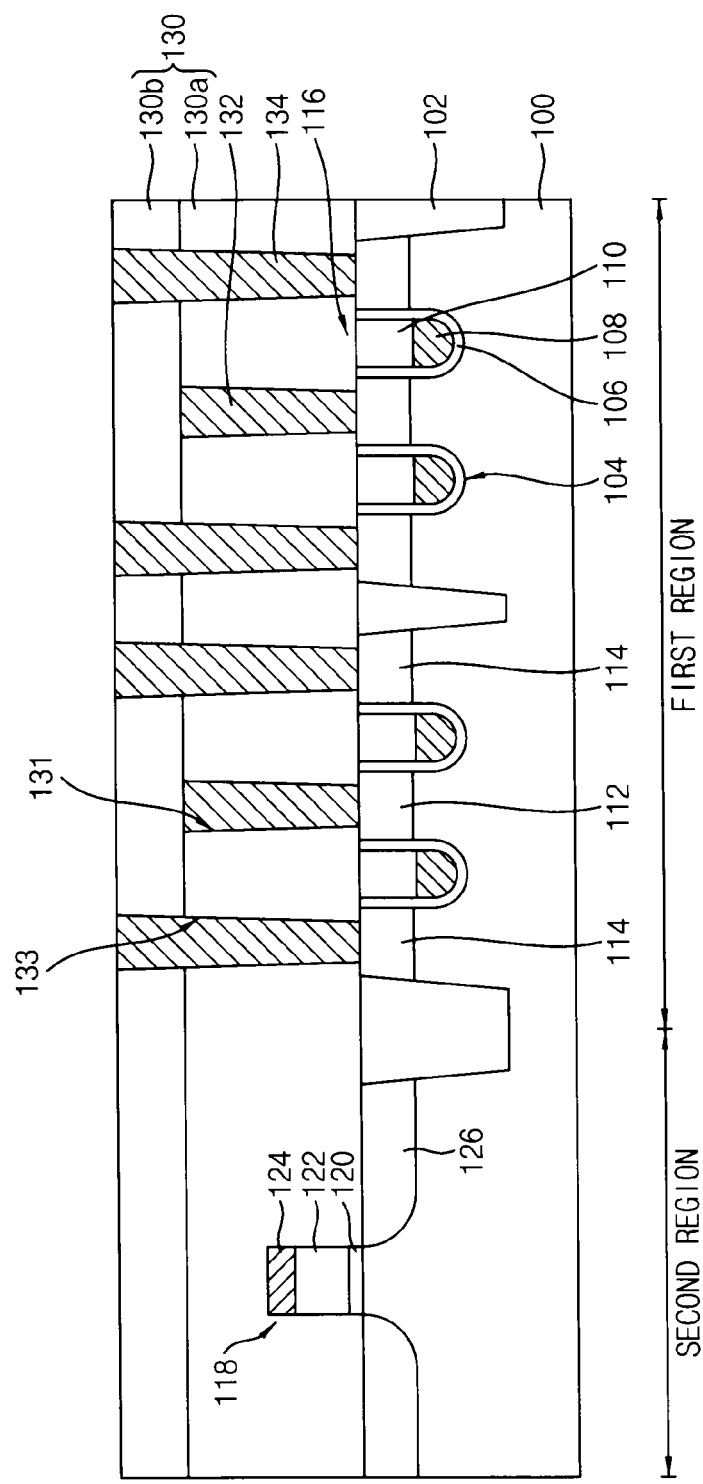

Referring to FIG. 3, a first lower insulating interlayer 130a may be formed on the first and second regions of the substrate 100 to cover the first and second transistors 116 and 118. The first lower insulating interlayer 130a may be planarized so that an upper surface of the first lower insulating interlayer 130a may be flat. In example embodiments, the planarization process may be performed by a chemical mechanical polishing (CMP) process and/or an etch-back process.

A portion of the first lower insulating interlayer 130a may be etched to form a first opening 131, which may expose a top surface of the first source region 112. The first opening 131 may extend in the first direction. A first conductive layer may be formed on the exposed top surface of the first source region 112 and the first lower insulating interlayer 130a to sufficiently fill the first opening 131, and may be planarized until the upper surface of the first lower insulating interlayer 130a may be exposed to form a source line 132 contacting the first source region 112. The source line 132 may be formed to include a metal, e.g., tungsten, titanium, tantalum, etc., and/or a metal nitride, e.g., tungsten nitride, titanium nitride, tantalum nitride, etc.

A second lower insulating interlayer 130b may be formed on the first lower insulating interlayer 130a and the source line 132. The first lower insulating interlayer 130a may have the flat upper surface, and thus the second lower insulating interlayer 130b may also have a flat upper surface. The first and second lower insulating interlayers 130a and 130b may be formed to include, e.g., silicon oxide.

The second and first lower insulating interlayers 130b and 130a may be partially etched to form second openings 133 therethrough exposing top surfaces of the first drain regions 114, respectively. A second conductive layer may be formed on the exposed top surfaces of the first drain regions 114 and the second lower insulating interlayer 130b to sufficiently fill the second openings 133, and may be planarized until the upper surface of the second lower insulating interlayer 130b may be exposed to form contact plugs 134 contacting the first drain regions 114, respectively. The contact plugs 134 may be formed to include a metal, e.g., tungsten, titanium, tantalum, etc., and/or a metal nitride, e.g., tungsten nitride, titanium nitride, tantalum nitride, etc.

Both of the first and second lower insulating interlayers 130a and 130b may be referred to simply as a first insulating interlayer 130. The first insulating interlayer 130 may be formed on the first and second regions of the substrate 100. The contact plugs 134 and the source line 132 may be formed through the first insulating interlayer 130 of the first region. The contact plugs 134 may have a top surface higher than that of the source line 132.

Figure 4:
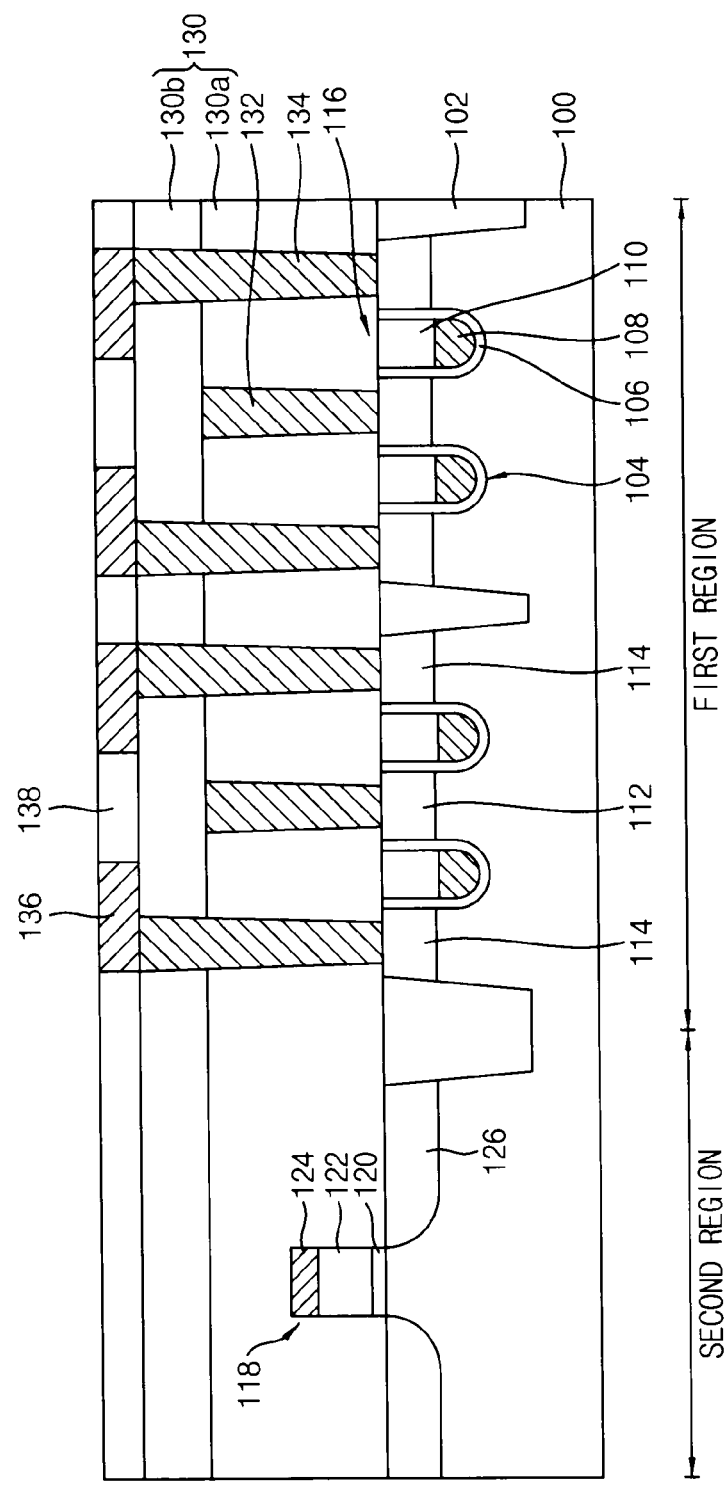

Referring to FIG. 4, a pad layer may be formed on the first insulating interlayer 130 and the contact plugs 134. The pad layer may be formed to include a metal, e.g., tungsten, titanium, tantalum, etc., and/or a metal nitride, e.g., tungsten nitride, titanium nitride, tantalum nitride, etc. The pad layer may be patterned to form pad patterns 136 on the contact plugs 134, respectively.

A preliminary insulation layer pattern 138 may be formed on the second lower insulating interlayer 130b to fill a gap between the pad patterns 136. The preliminary insulation layer pattern 138 may be formed to include, e.g., silicon nitride or silicon oxide.

Figure 5:
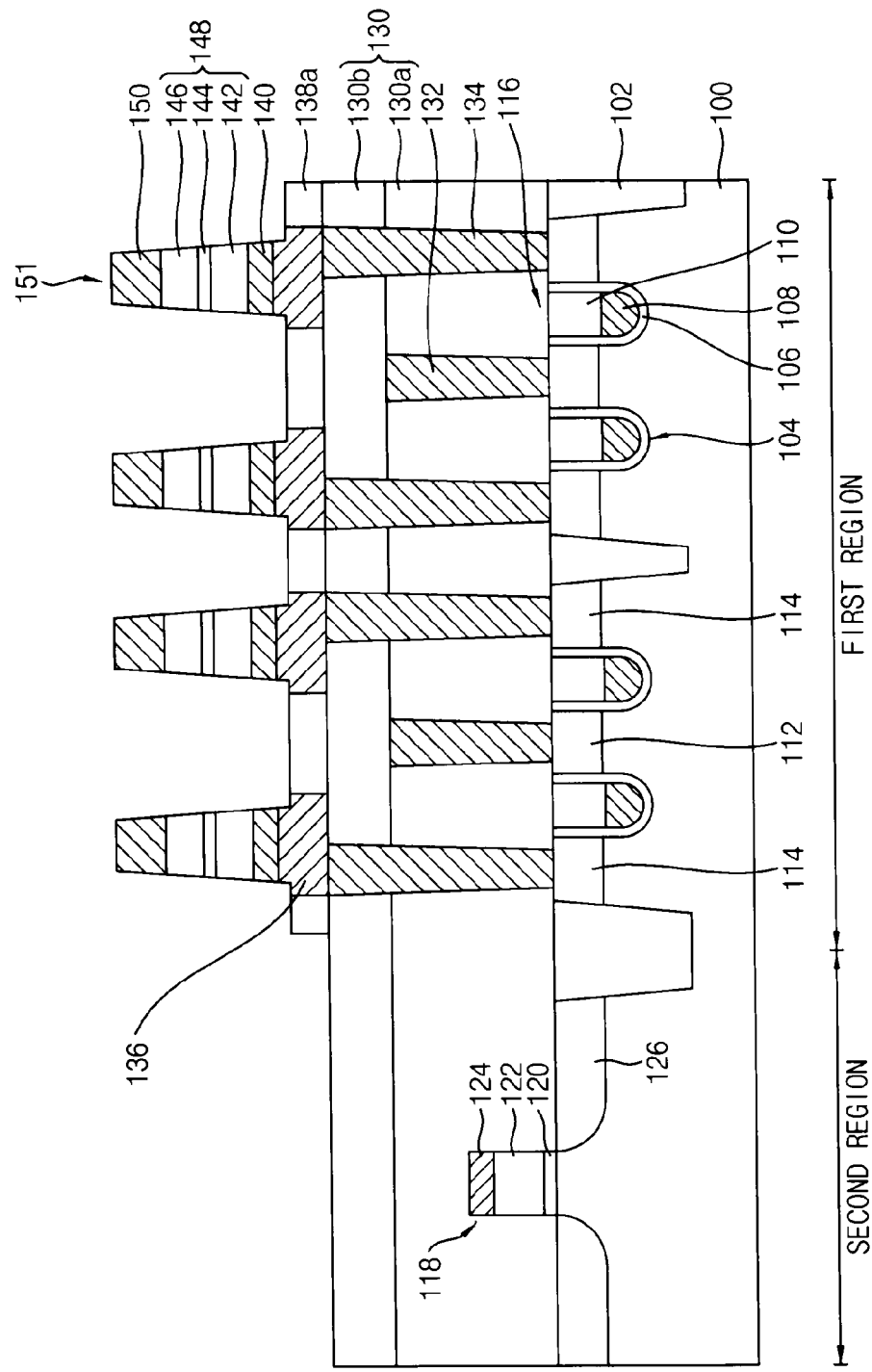

Referring to FIG. 5, MTJ structures 151 having a pillar shape may be formed on the pad patterns 136, respectively. Each of the MTJ structures 151 may include a sequentially stacked lower electrode 140, an MTJ pattern 148 and an upper electrode 150. In example embodiments, the MTJ pattern 148 may include a sequentially stacked fixed layer pattern 142, a tunnel barrier layer pattern 144 and a free layer pattern 146.

In particular, a lower electrode layer, a fixed layer, a tunnel barrier layer, a free layer and an upper electrode layer may be sequentially formed on the pad patterns 136 and the preliminary insulation layer pattern 138, and the upper electrode layer may be patterned by a photolithography process to form the upper electrode 150. By a dry-etch process using the upper electrode 150 as an etching mask, the free layer, the tunnel barrier layer, the fixed layer and the lower electrode layer may be patterned to form the MTJ structures 151 contacting the pad patterns 136, respectively.

The lower and upper electrode layers may be formed to include a metal and/or a metal nitride.

In an example embodiment, a lower ferromagnetic layer, an anti-ferromagnetic coupling spacer layer and an upper ferromagnetic layer may be further formed on the fixed layer.

The fixed layer may be formed to include, e.g., FeMn, IrMn, PtMn, MnO, MnS, MnTe, $MnF_2$, $FeF_2$, $FeCl_2$, FeO, $CoCl_2$, CoO, $NiCl_2$, NiO, Cr, etc. The lower and upper ferromagnetic layers may be formed to include, e.g., Fe, Ni, Co, etc. The anti-ferromagnetic coupling spacer layer may be formed to include, e.g., Ru, Ir, Rh, etc.

The tunnel barrier layer may be formed to include, e.g., aluminum oxide or magnesium oxide.

The free layer may be formed to include a ferromagnetic material containing, e.g., Fe, Ni, Co, etc.

The MTJ structures 151 may not be limited to the above composition, and other various modifications may be available.

The MTJ structures 151 may be only formed on the first region of the substrate 100. Thus, the lower electrode layer, the fixed layer, the tunnel barrier layer, the free layer and the upper electrode layer on the second region of the substrate 100 may be removed during the dry-etch process. In the dry-etch process, etching target layers formed on the second region may be etched faster than etching target layers formed between the MTJ structures 151 on the first region. Thus, almost all of the preliminary insulation layer pattern 138 formed on the second region may be etched, while a portion of the preliminary insulation layer pattern 138 formed on the first region may remain so as to form an insulation layer pattern 138a. Alternately, a portion of the preliminary insulation layer pattern 138 formed on the second region may also remain.

Figure 6:
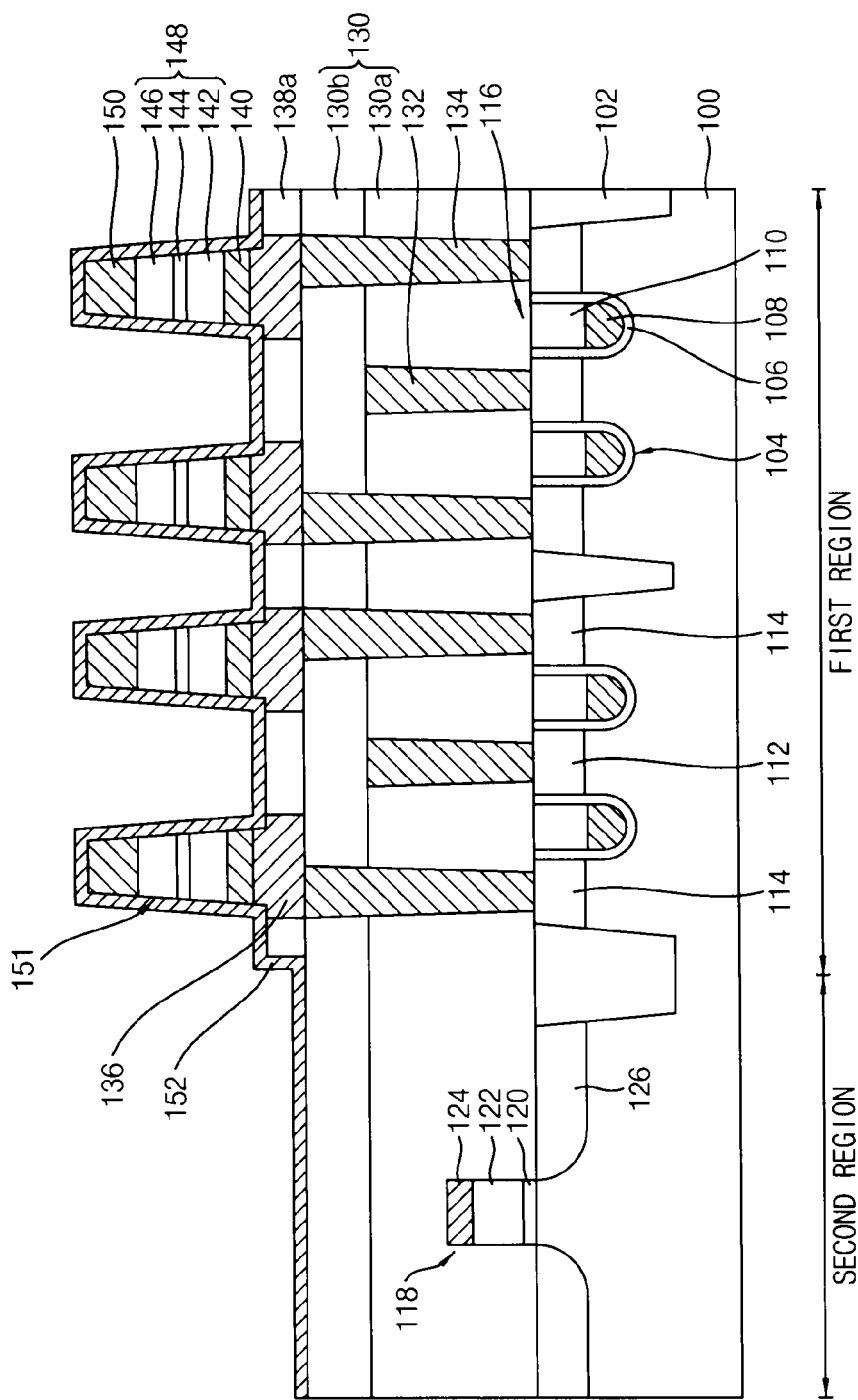

Referring to FIG. 6, a preliminary capping layer 152 may be formed on the first insulation layer 130, the MTJ structures 151, and the insulation layer pattern 138a.

The preliminary capping layer 152 on the first region may be conformally formed on surfaces of the MTJ structures 151, and may not fill a gap between the MTJ structures 151. Thus, an upper surface of the preliminary capping layer 152 may have different heights in accordance with positions thereof on the first region. That is, a portion of the upper surface of the preliminary capping layer 152 formed on a top surface of each of the MTJ structures 151 may be highest on the first region. While, an upper surface of the preliminary capping layer 152 on the second region may be located at substantially the same height.

The preliminary capping layer 152 may be formed to include an insulating material, which may serve as an etch ending-point detect layer during an etching process of a silicon oxide layer. That is, a light may be emitted from the preliminary capping layer 152 including the insulating material, which may have a wavelength that is different from a wavelength of a light emitted from a silicon oxide. For example, the preliminary capping layer 152 may include, e.g., silicon nitride, silicon oxy nitride, etc.

The preliminary capping layer 152 may be formed on the surfaces of the MTJ structures 151, so that may serve as a protective layer of the MTJ structures 151.

If a thickness of the preliminary capping layer 152 may be smaller than about 50 Å, the preliminary capping layer 152 may be hardly used as the protective layer and the etch ending-point detect layer. Also, if the thickness of the preliminary capping layer 152 may be greater than about 300 Å, a time for etching the preliminary capping layer 152 may increase excessively. Thus, the preliminary capping layer 152 may be formed to have a thickness of about 50 Å to 300 Å.

Figure 7:
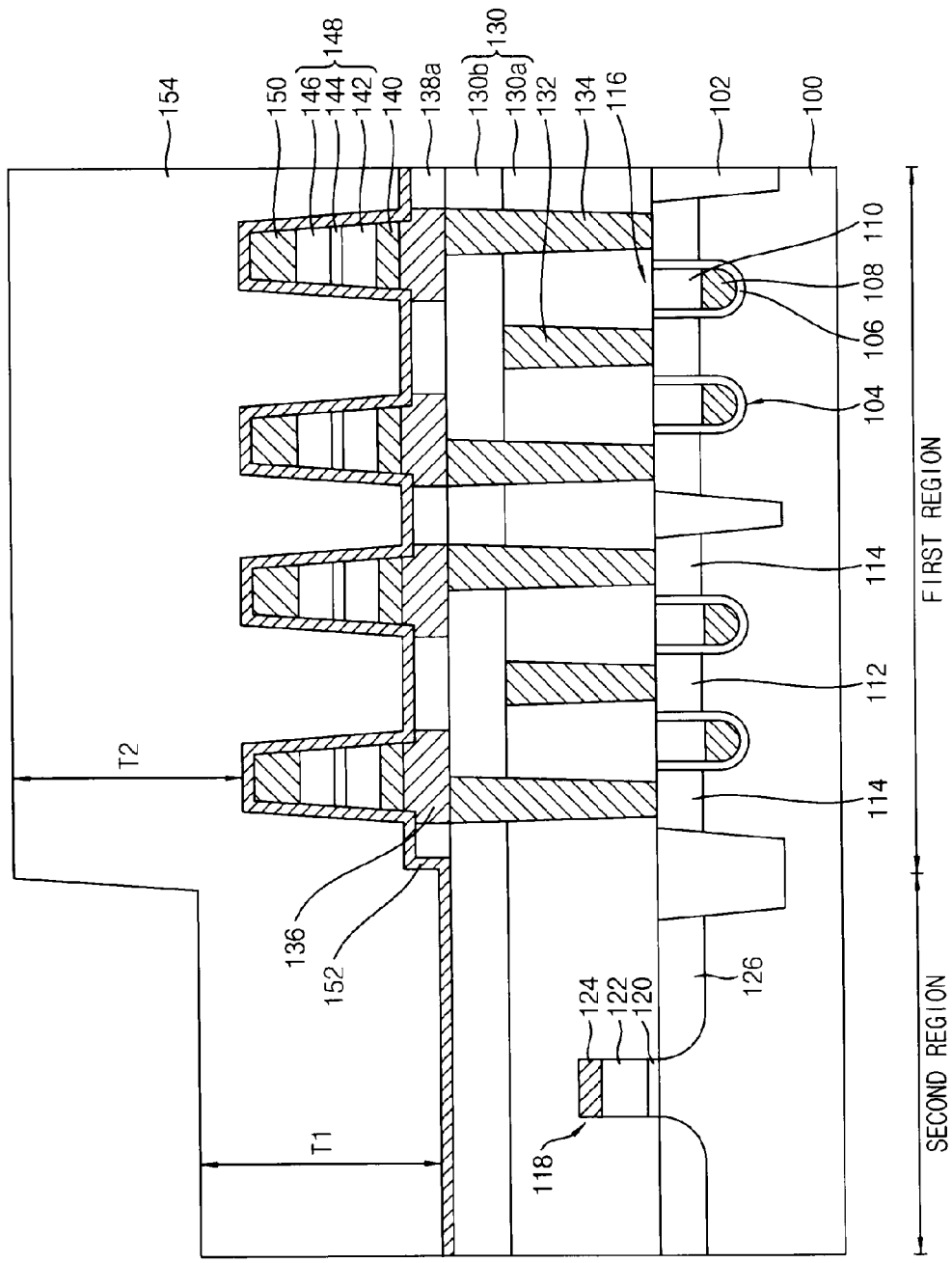

Referring to FIG. 7, a filling layer 154 including an insulating material may be formed on the preliminary capping layer 152. The filling layer 154 may be formed to include a material having a good step coverage so as to fill a gap between the MTJ structures 151. For example, the filling layer 154 may be formed to include silicon oxide by an atomic layer deposition (ALD) process.

The MTJ structures 151 may be formed on the first region only. Thus, upper surfaces of the filling layer 154 of the first and second regions may not be located at the same height, particularly, an upper surface of the filling layer 154 on the first region may be higher than an upper surface of the filling layer 154 on the second region. The upper surface of the filling layer 154 on the second region may be higher than a top surface of the preliminary capping layer 152 on the first region. The filling layer 154 may have a flat upper surface on each of the first and second regions.

A difference between a first thickness T1 of the filling layer 154 on the second region and a second thickness T2 of the filling layer 154 on the top surface of the preliminary capping layer 152 on the first region may be less than about 10% of the first thickness T1. Preferably, the first thickness T1 may be substantially the same as the second thickness T2.

Figure 8:
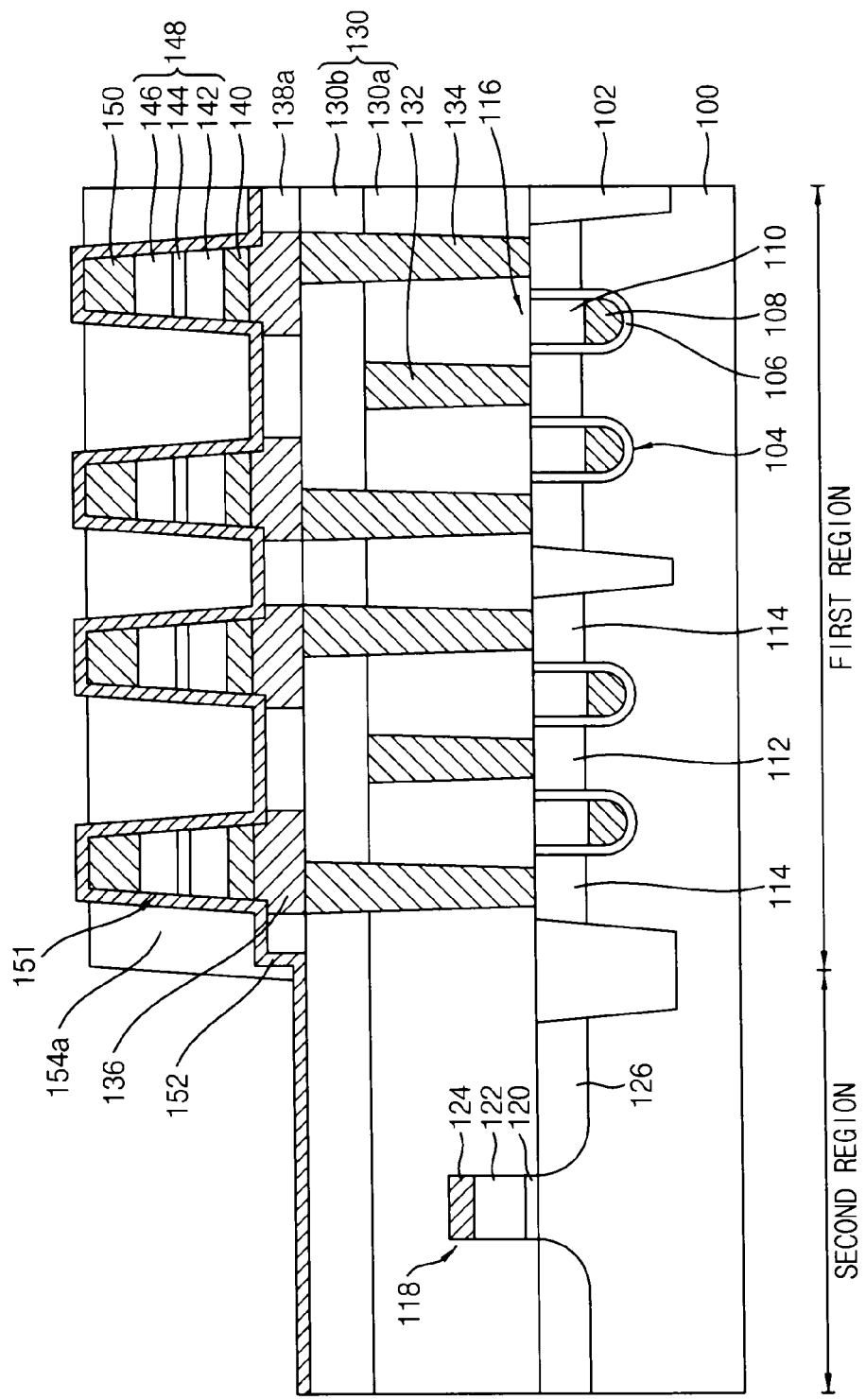

Referring to FIG. 8, the filling layer 154 may be etched by, e.g., an etch-back process using the preliminary capping layer 152 on the second region as the etch ending-point detect layer. That is, during a plasma etching process, a wavelength of light emitted by a chemical reaction from an etched layer may be detected. When a wavelength of light emitted from the preliminary capping layer 152 on the second region starts to be detected, the plasma etching process may be stopped. The preliminary capping layer 152 may be formed on an entire upper surface of the first insulating interlayer 130 on the second region to have a uniform thickness, so that the preliminary capping layer 152 on the second region may serve as an etch ending-point detect layer.

In the plasma etching process, the top surface of the preliminary capping layer 152 on the MTJ structures 151 on the first region may be exposed. That is, an upper surface of the preliminary capping layer 152 on the first region may not be entirely exposed, so that the preliminary capping layer 152 on the first region may be suitable neither for an etch ending-point detect layer nor for an etch-stop layer.

When the preliminary capping layer 152 on the second region may be detected, an upper portion of the filling layer 154 on the MTJ structures 151 may be removed, and a lower portion of the filling layer 154 between the MTJ structures 151 may remain. Thus, a filling layer pattern 154a may be formed between the MTJ structures 151, and the top surfaces of the preliminary capping layer 152 on the MTJ structures 151 may be exposed.

The filling layer 154 may be partially removed by the etch-back process, so that upper surfaces of structures formed on the first and second regions, respectively, may not be located at the same height. Particularly, a first upper surface of a first structure on the first region may be higher than a second upper surface of a second structure on the second region. The entire upper surface of the preliminary capping layer 152 may be exposed on the second region, and the top surfaces of the preliminary capping layer 152 on the MTJ structures 151 and the filling layer pattern 154a may be exposed.

The first thickness T1 may be substantially the same as the second thickness T2 before the etch-back process, so that the upper surfaces of the preliminary capping layer 152 and the filling layer pattern 154a on the first region after the etch-back process may be almost coplanar with each other. In example embodiments, the top surface of the filling layer pattern 154a may be substantially coplanar with the top surface of each of the MTJ structures 151. Alternatively, the top surface of the filling layer pattern 154a may be substantially coplanar with the top surface of the preliminary capping layer 152.

By the etch-back process, the top surface of the filling layer pattern 154a and the top surface of the preliminary capping layer 152 on the first region may be almost flat, and may not have much variation.

If, however, the filling layer 154 is removed by a chemical mechanical polishing (CMP) process, a polishing rate of the filling layer 154 may vary in accordance with the density difference of lower structures, so that the top surface of the preliminary capping layer 152 and the top surface of the filling layer pattern 154a on the first region may have high height variations, which may cause process failures. Also, if the filling layer 154 is removed by the CMP process, the filling layer 154 may remain even on the second region.

Figure 9:
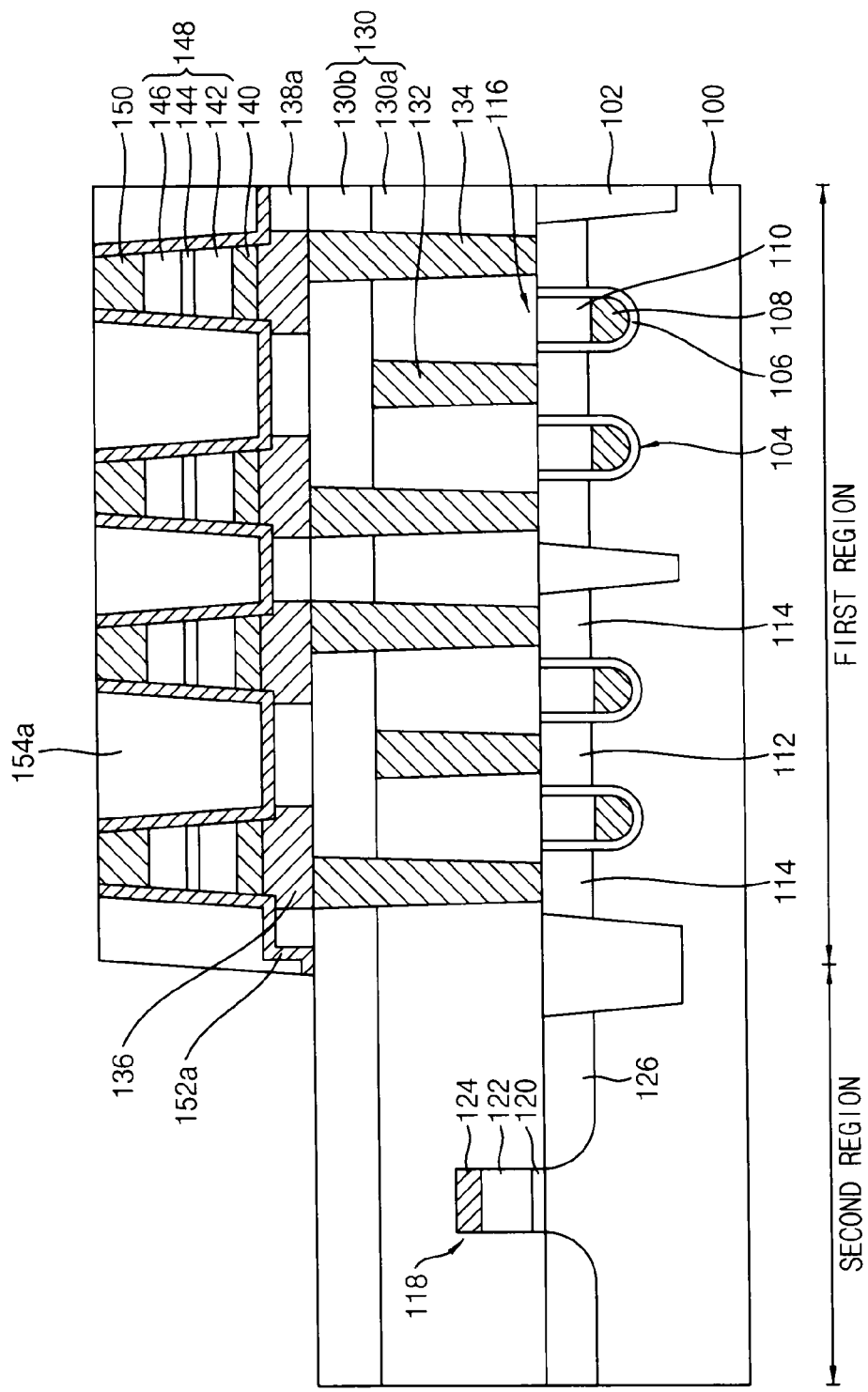

Referring to FIG. 9, the exposed portion of the preliminary capping layer 152 on the first and second regions may be etched by an etch-back process. Thus, almost the entire portion of the preliminary capping layer 152 on the second region may be removed, while a portion of the preliminary capping layer 152 on the first region may be partially etched so as to form a capping layer pattern 152a. The capping layer pattern 152a may be formed on sidewalls of the MTJ structures 151, the pad pattern 136 between the MTJ structures 151 and the insulation layer pattern 138a.

The top surfaces of the MTJ structures 151 on the first region may be exposed.

The capping layer pattern 152a may have a thin thickness, and the top surfaces of the MTJ structures 151 and filling layer pattern 154a may be almost flat after the etch-back process for the preliminary capping layer 152. The upper surface of the first insulating interlayer 130 on the second region may be exposed.

Figure 10:
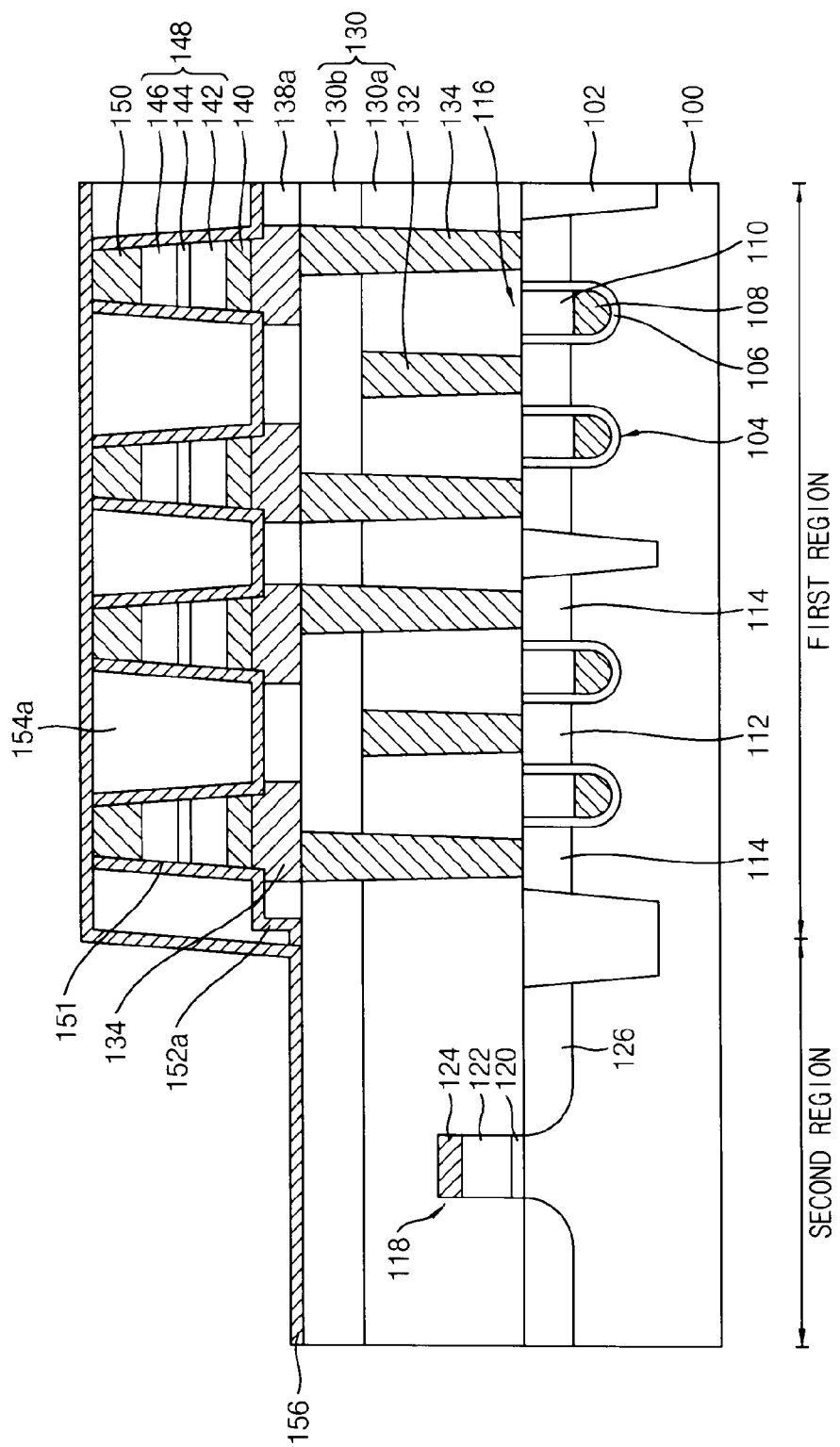

Referring to FIG. 10, a preliminary etch-stop layer 156 may be formed on the first insulating interlayer 130, the MTJ structures 151, the filling layer pattern 154a and the capping layer pattern 152a. The preliminary etch-stop layer 156 may have an insulation material having an etching selectivity with respect to a second insulating interlayer 158 (refer to FIG. 11) including subsequently formed silicon oxide, and may include, e.g., silicon nitride, silicon oxynitride, aluminum oxide, etc.

The preliminary etch-stop layer 156 may be conformally formed on the first and second regions, and may extend from the upper surface of the first insulating interlayer 130 on the second region to the top surfaces of the filling layer pattern 154a and the MTJ structures 151 on the first region. Also, a first portion of the preliminary etch-stop layer 156 on the first region may be formed on the MTJ structures 151 and the filling layer pattern 154a to have a first flat upper surface, and a second portion of the preliminary etch-stop layer 156 on the second region may be formed on the first insulating interlayer 130 to have a second flat upper surface that is lower than the first flat upper surface. The preliminary etch-stop layer 156 may be formed on a sidewall of the filling layer pattern 154a at an interface between the first and second regions.

Figure 11:
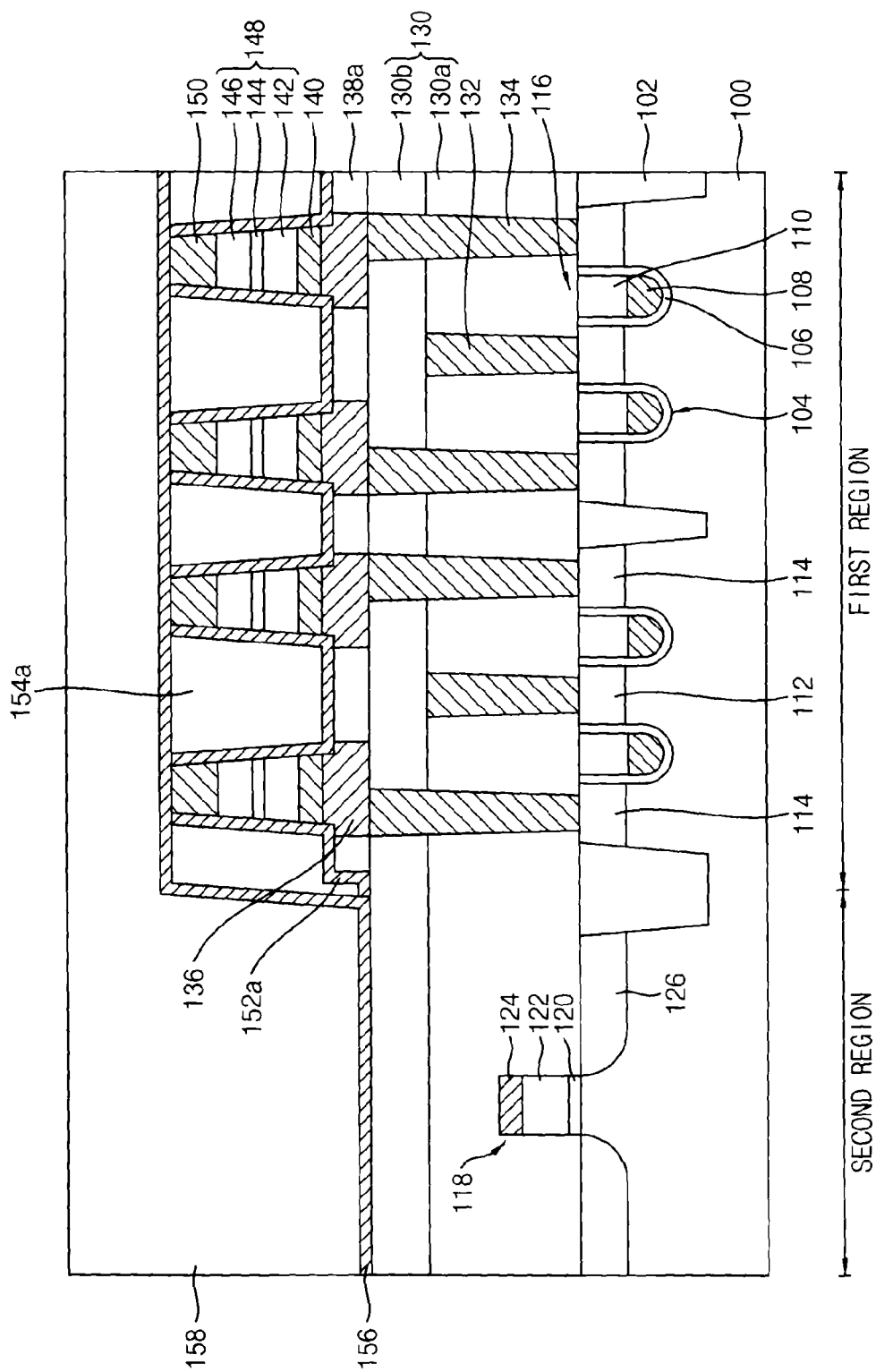

Referring to FIG. 11, the second insulating interlayer 158 may be formed on the preliminary etch-stop layer 156. The second insulating interlayer 158 may be planarized so that an upper surface of the second insulating interlayer 158 on the first and second regions may be flat. In example embodiments, the planarization process may be performed by a CMP process and/or an etch-back process.

The second insulating interlayer 158 may be formed to include, e.g., silicon oxide.

Figure 12:
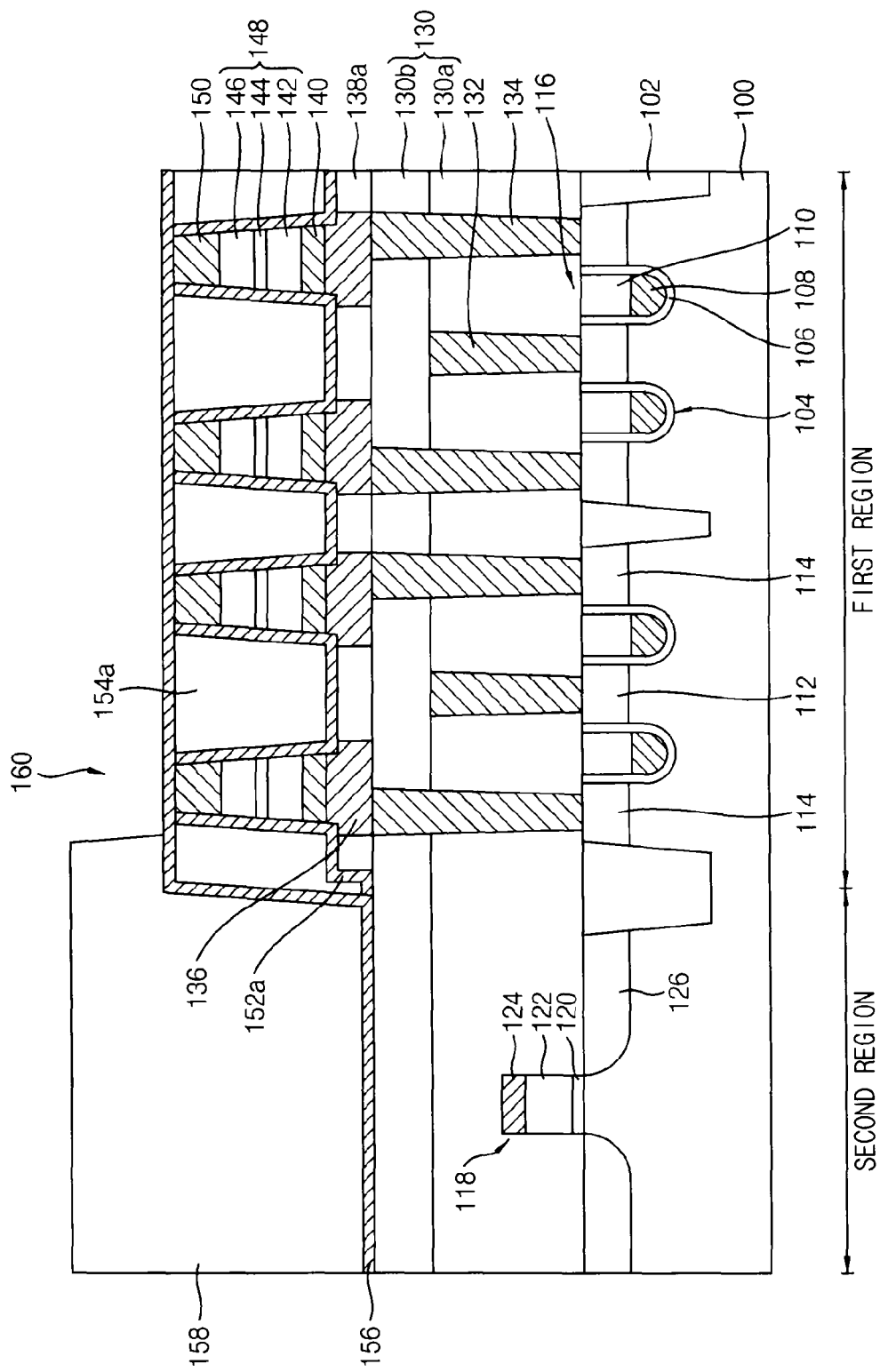

Referring to FIG. 12, a portion of the second insulating interlayer 158 on the first region may be etched to form a preliminary trench 160 for forming a bit line. In example embodiments, a plurality of preliminary trenches 160 each of which may extend in a second direction that is substantially perpendicular to the first direction may be formed.

The second insulating interlayer 158 may be etched until the top surface of the preliminary etch-stop layer 156 may be exposed. In example embodiments, the second insulating interlayer 158 may be etched under an etching condition in which the second insulating interlayer 158 may have an etching selectivity with respect to the preliminary etch-stop layer 156. Alternatively, the second insulating interlayer 158 may be etched using the preliminary etch-stop layer 156 serving as an etch ending-point detect layer. Particularly, the second insulating interlayer 158 may be etched until a light having a wavelength from the preliminary etch-stop layer 156 may be detected.

The preliminary etch-stop layer 156 may be formed on the first region entirely, and the first upper surface of the preliminary etch-stop layer 156 on the first region may be flat. Thus, in the etch process, the second insulating interlayer 158 may be exactly etched until the first upper surface of the preliminary etch-stop layer 156 may be exposed.

Figure 13:
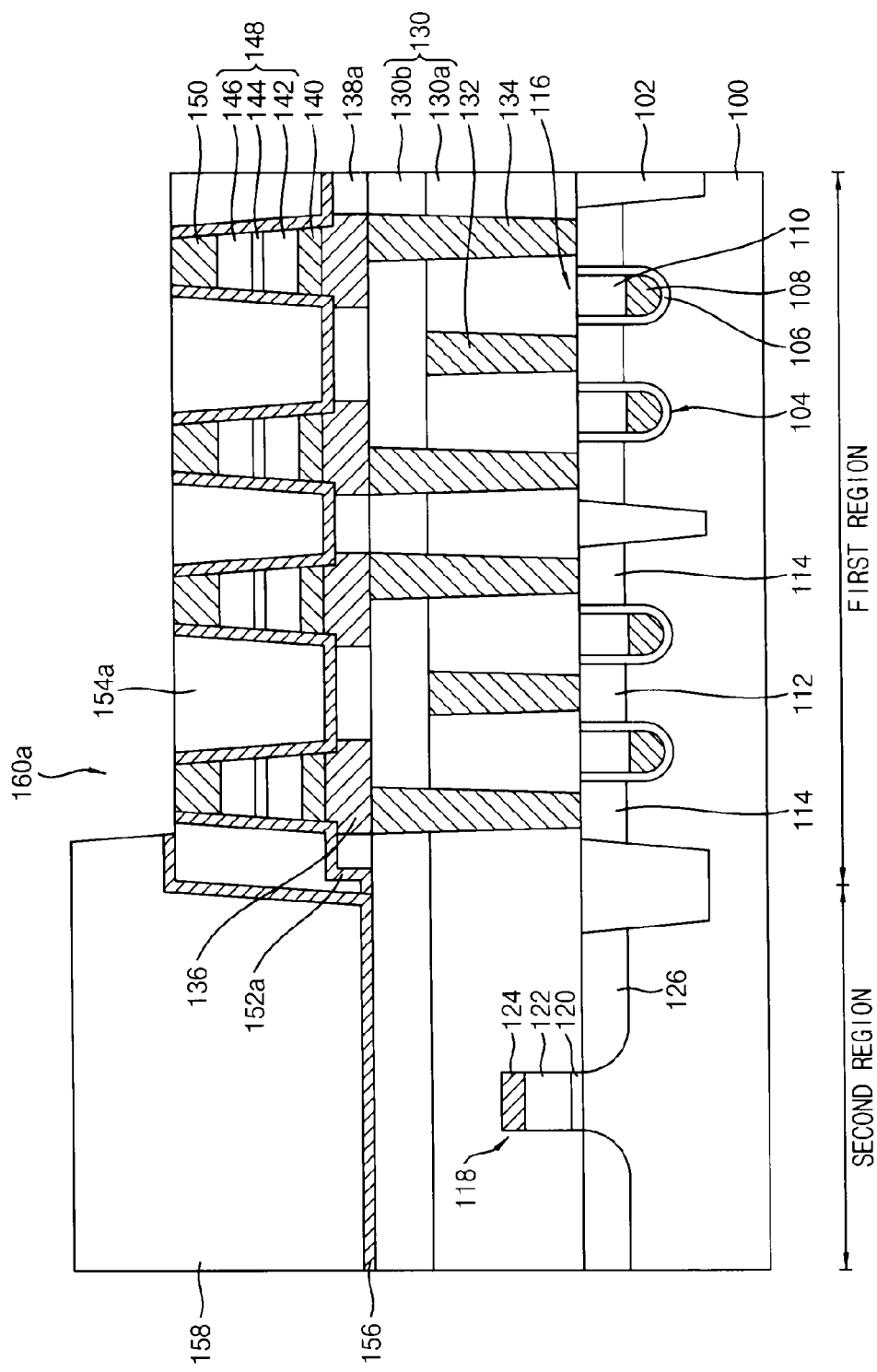
Figure 14:
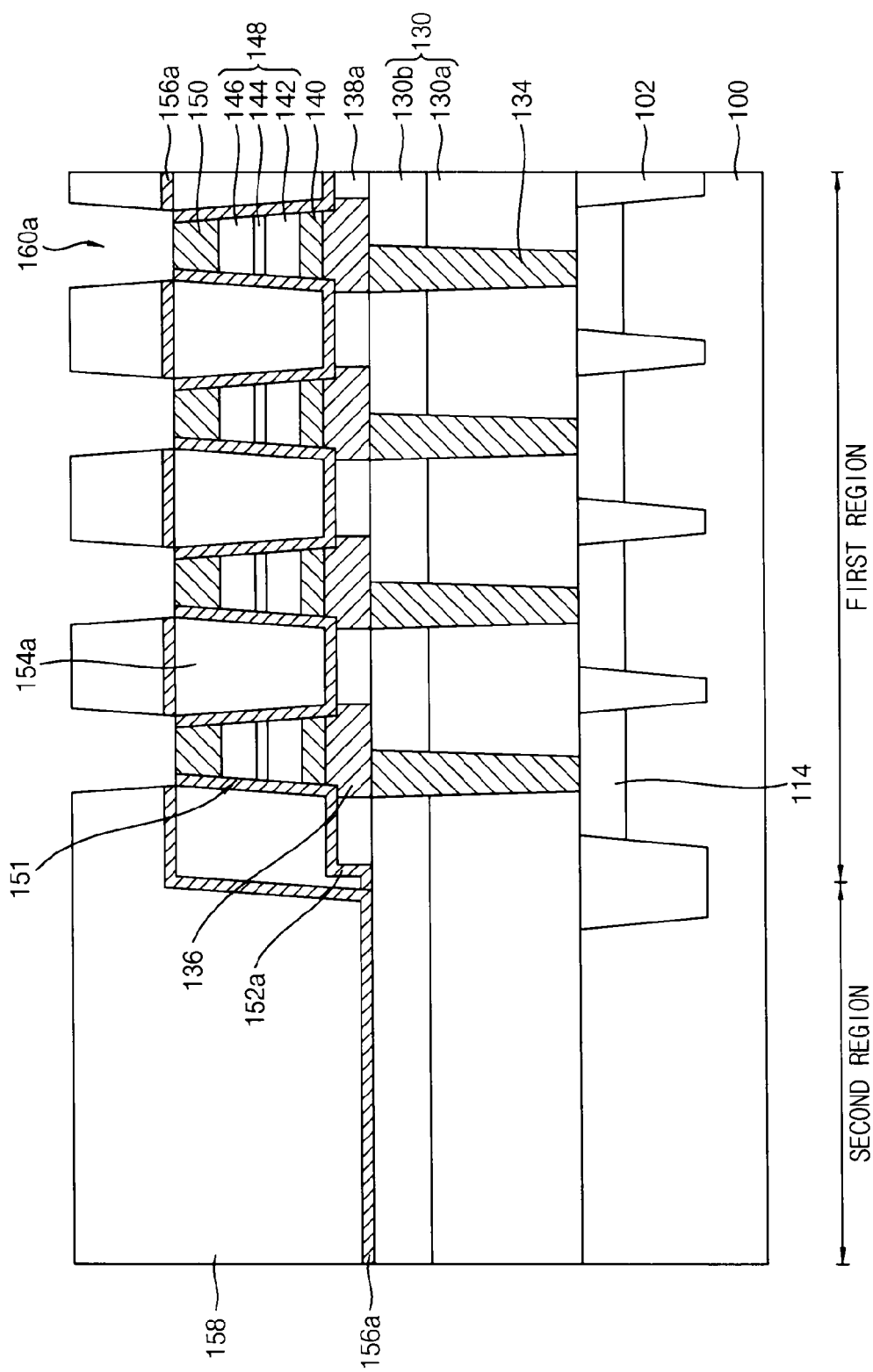

Referring to FIGS. 13 and 14, the first portion of the preliminary etch-stop layer 156 on the first region exposed by the preliminary trenches 160 may be etched to form trenches 160a and an etch-stop layer 156a. The top surfaces of the MTJ structures 151 may be exposed by the trenches 160a. The etch-stop layer 156a may be formed on the first insulating interlayer 130 on the second region and the filling layer pattern 154a between the preliminary trenches 160 on the first region. The etch-stop layer 156a may not end at an interface between the first and second regions. That is, the etch-stop layer 156a may be formed at a sidewall of the filling layer pattern 154a at the interface between the first and second regions.

The preliminary etch-stop layer 156 may be formed on the MTJ structures 151 to have a flat top surface, so that bottom surfaces of the trenches 160a, which may be formed by etching the preliminary etch-stop layer 156, may be flat.

The second insulating interlayer 158 may be exactly etched using the preliminary etch-stop layer 156 so that damages to the MTJ structures 151 may decrease and each of the MTJ structures 151 may have a uniform thickness. That is, the second insulating interlayer 158 may be exactly etched using the preliminary etch-stop layer 156 so that the damages to the upper electrodes 150 of the MTJ structures 151 may decrease, and the upper electrodes 150 of the MTJ structures 151 may have a uniform thickness. Also, the MTJ structures 151 may be certainly exposed by the trenches 160a, and the MTJ structures 151 may not be over-etched.

Figure 15:
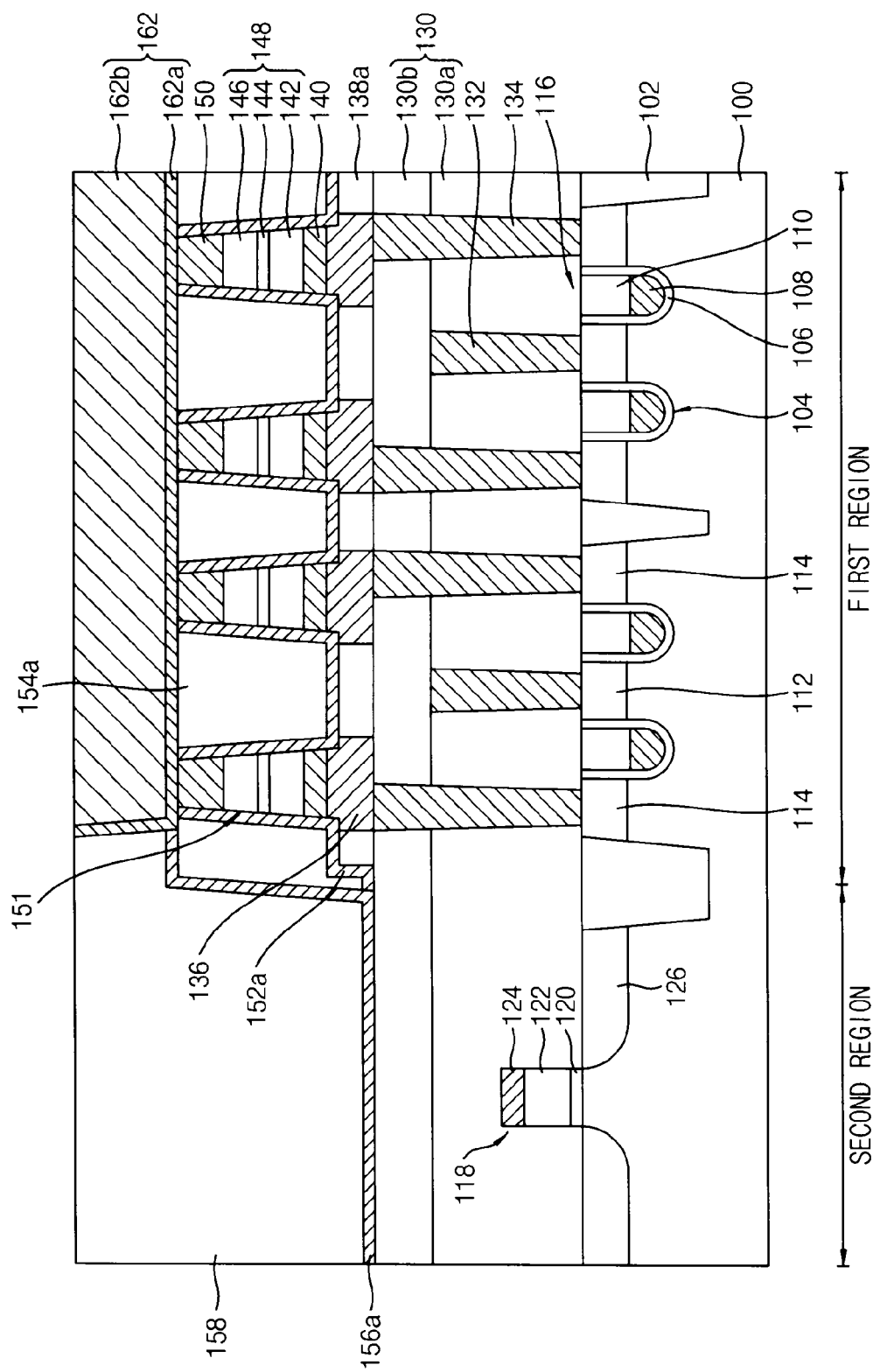
Figure 16:
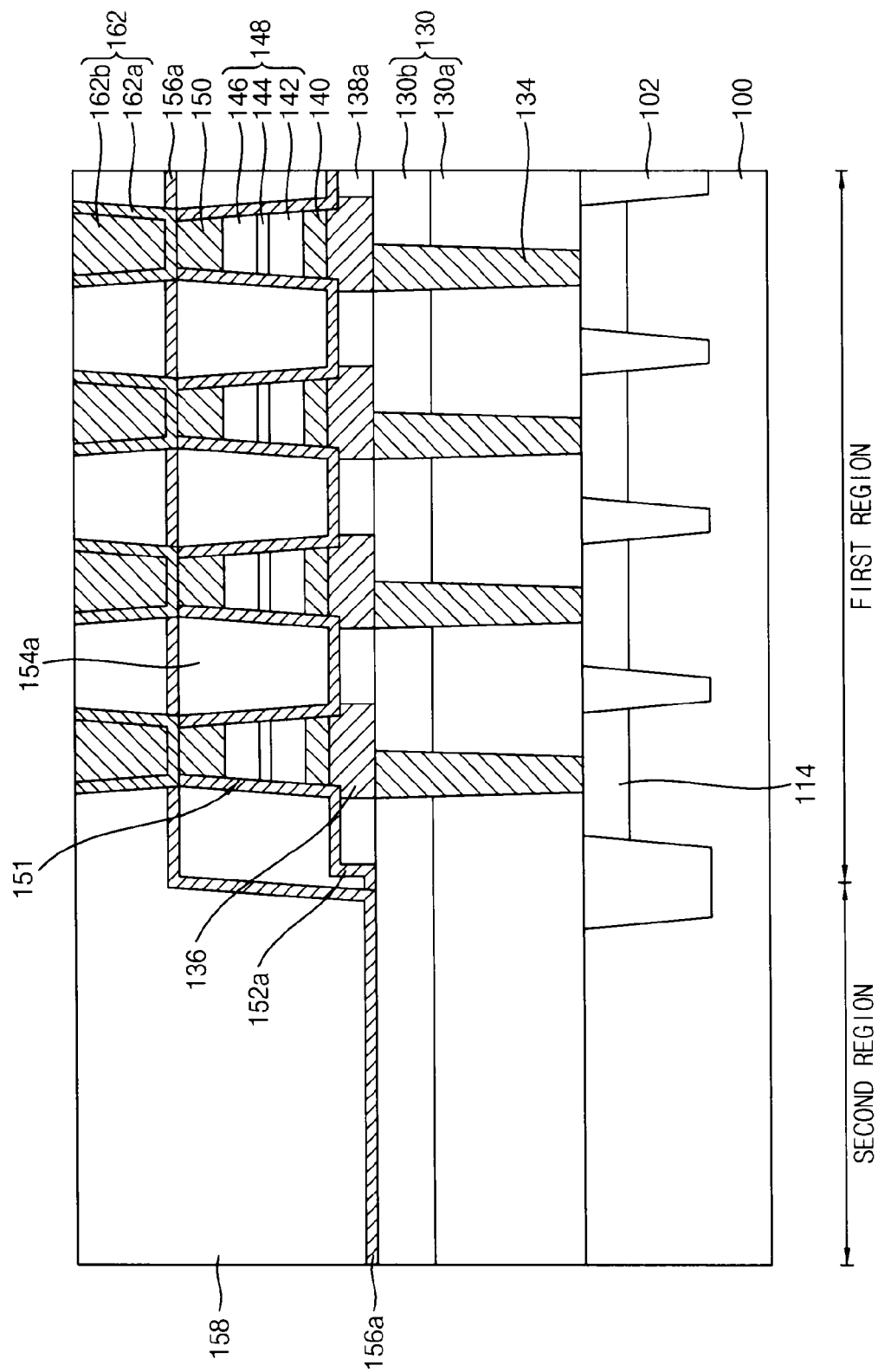

Referring to FIGS. 15 and 16, a bit line 162 may be formed in each of the trenches 160a. The bit line 162 may be formed to include a barrier layer pattern 162a and a metal layer pattern 162b. Particularly, a barrier layer may be formed on sidewalls and bottom surfaces of the trenches 160a. A metal layer may be formed on the barrier layer to fill the trenches 160a, and the metal layer and the barrier layer may be planarized until the upper surface of the second insulating interlayer 158 may be exposed to form the metal layer pattern 162b and the barrier layer pattern 162a, respectively. The barrier layer may be formed to include a metal, e.g., titanium, tantalum, etc., and/or a metal nitride, e.g., titanium nitride, tantalum nitride, etc. The metal layer may be formed to include, e.g., Cu, W, Al, etc.

The bit line 162 may be formed on the upper electrodes 150 of the MTJ structures 151. The upper electrodes 150 may have a uniform thickness so that an MRAM device may have a reduced resistance distribution between each of the MTJ structures 151 and the bit line 162.

Figure 17:
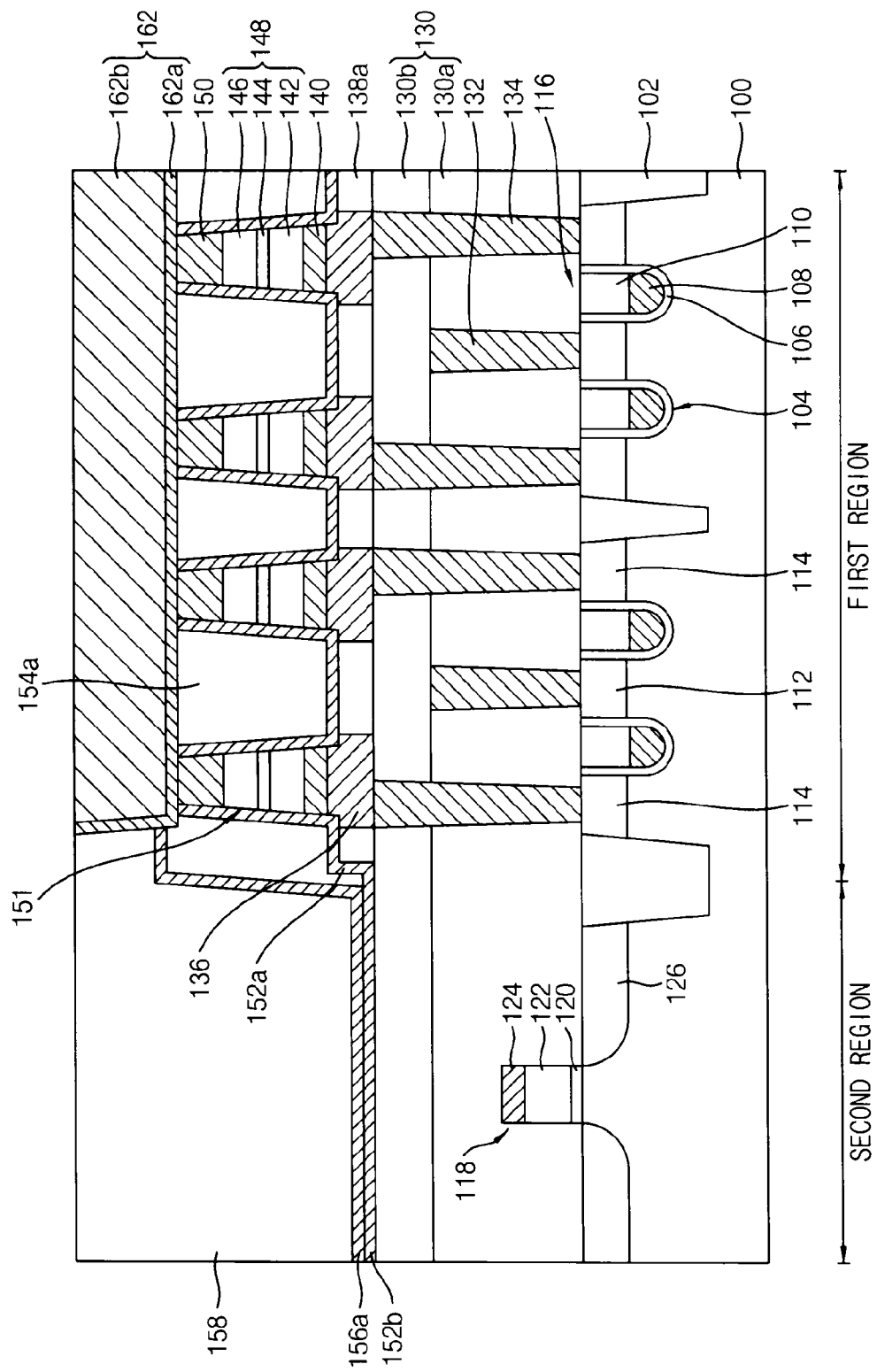

FIG. 17 is a cross-sectional view illustrating an MRAM device in accordance with example embodiments.

The MRAM device of FIG. 17 may be substantially the same as or similar to that illustrated with reference to FIGS. 1A, 1B and 1C except for the capping layer pattern 152b.

Referring to FIG. 17, first transistors 116 may be formed on the first region of the substrate 100, and second transistors 118 may be formed on the second region of the substrate 100. A first insulating interlayer 130 may be formed on the substrate 100 to cover the first and second transistors 116 and 118.

A source line 132 may be formed through the first insulating interlayer 130, and may be electrically connected to a first source region 112 of the first transistors 116. Contact plugs 134 may be formed through the first insulating interlayer 130 to contact the first drain regions 114 of the first transistors 116. Pad patterns 136 and MTJ structures 151 may be formed on the contact plugs 134. An insulation layer pattern 138a may be formed to fill a gap between the pad patterns 136.

A capping layer pattern 152b may be conformally formed on the insulation layer pattern 138a and sidewalls of the MTJ structures 151 on the first region, and the first insulating interlayer 130 on the second region. The capping layer pattern 152b may not end at an interface between the first and second regions, and may be formed on sidewalls of the MTJ structures 151. That is, the capping layer pattern 152b may be formed on both of the first and second regions.

The capping layer pattern 152b may include an insulating material. The insulating material of the capping layer pattern 152b may provide an etch ending-point detect signal during etching a silicon oxide layer. Also, the insulating material of the capping layer pattern 152b may have an etching selectivity with respect to the filling layer pattern 154a including silicon oxide, and may include, e.g., silicon nitride, silicon oxynitride, etc.

The filling layer pattern 154a may be formed on the capping layer pattern 152b to fill the gap between the MTJ structures 151. The filling layer pattern 154a may not be formed on the second region of the substrate 100, but may be formed only on the first region of the substrate 100.

A bit line 162 may be formed on the filling layer pattern 154a and the MTJ structures 151. The bit line 162 may contact the MTJ structures 151, and extend in the second direction. In example embodiments, a plurality of bit lines 162 may be formed to be substantially parallel to each other.

An etch-stop layer 156a may be formed on the filling layer pattern 154a between the bit lines 162 on the first region and the capping layer pattern 152b on the second region. Top surfaces of the filling layer pattern 154a on the first region and the first insulating interlayer 130 on the second region may not be located at the same height, and a first portion of a first upper surface of the etch-stop layer 156a on the first region may be higher than a second portion of a second upper surface of the etch-stop layer 156a on the second region. The etch-stop layer 156a may have substantially the same thickness on the first and second regions, and the etch-stop layer 156a of the first and second regions may have flat surfaces, respectively. The etch-stop layer 156a may include a material having an etching selectivity with respect to a second insulating interlayer 158 including silicon oxide, and may include, e.g., silicon nitride, silicon oxynitride, aluminum oxide, etc. In example embodiments, the etch-stop layer 156a may include a material substantially the same as that of the capping layer pattern 152b. Alternatively, the etch-stop layer 156a may include a material that is different from that of the capping layer pattern 152b The second insulating interlayer 158 may be formed on the etch-stop layer 156a on the first and second regions. That is, the second insulating interlayer 158 may be formed between the bit lines 162 on the first region.

FIGS. 18 to 21 are cross-sectional views illustrating stages of a method of manufacturing the MRAM device of FIG. 17.

First, processes substantially the same as or similar to those illustrated with reference to FIGS. 2 to 7 may be performed to form a structure of FIG. 7.

Figure 18:
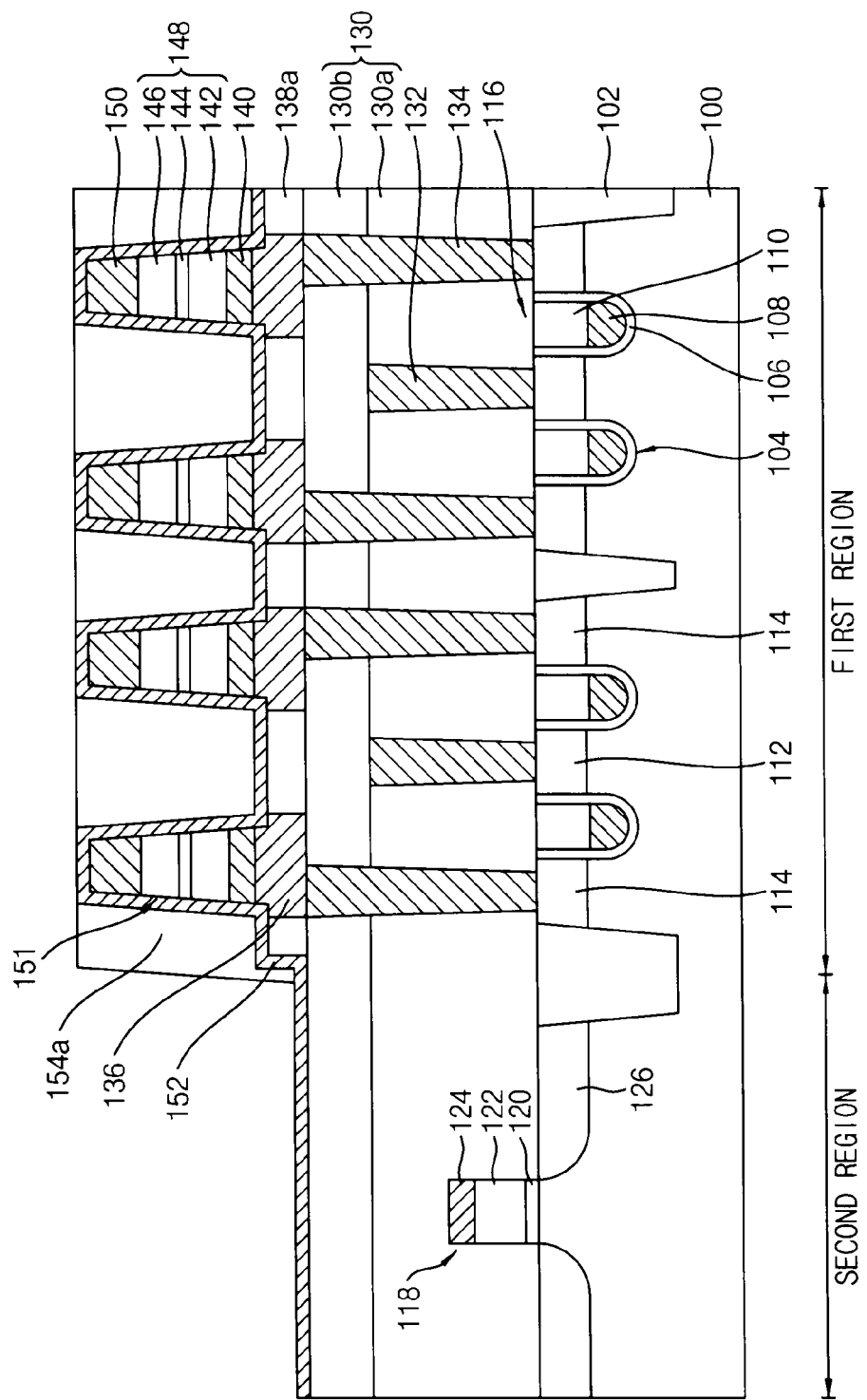

Referring to FIG. 18, the filling layer 154 may be etched by an etch-back process using the preliminary capping layer 152 on the second region as an etch ending-point detect layer. When the preliminary capping layer 152 on the second region is detected, a portion of the filling layer 154 on the MTJ structures 151 may be removed, and a portion of the filling layer 154 formed between the MTJ structures 151 may remain. Thus, a filling layer pattern 154a may be formed between the MTJ structures 151 on the first region, and a top surface of the preliminary capping layer 152 on the MTJ structures 151 may be exposed. In example embodiments, an upper surface of the filling layer pattern 154a may be substantially coplanar with the exposed top surface of the preliminary capping layer 152.

Figure 19:
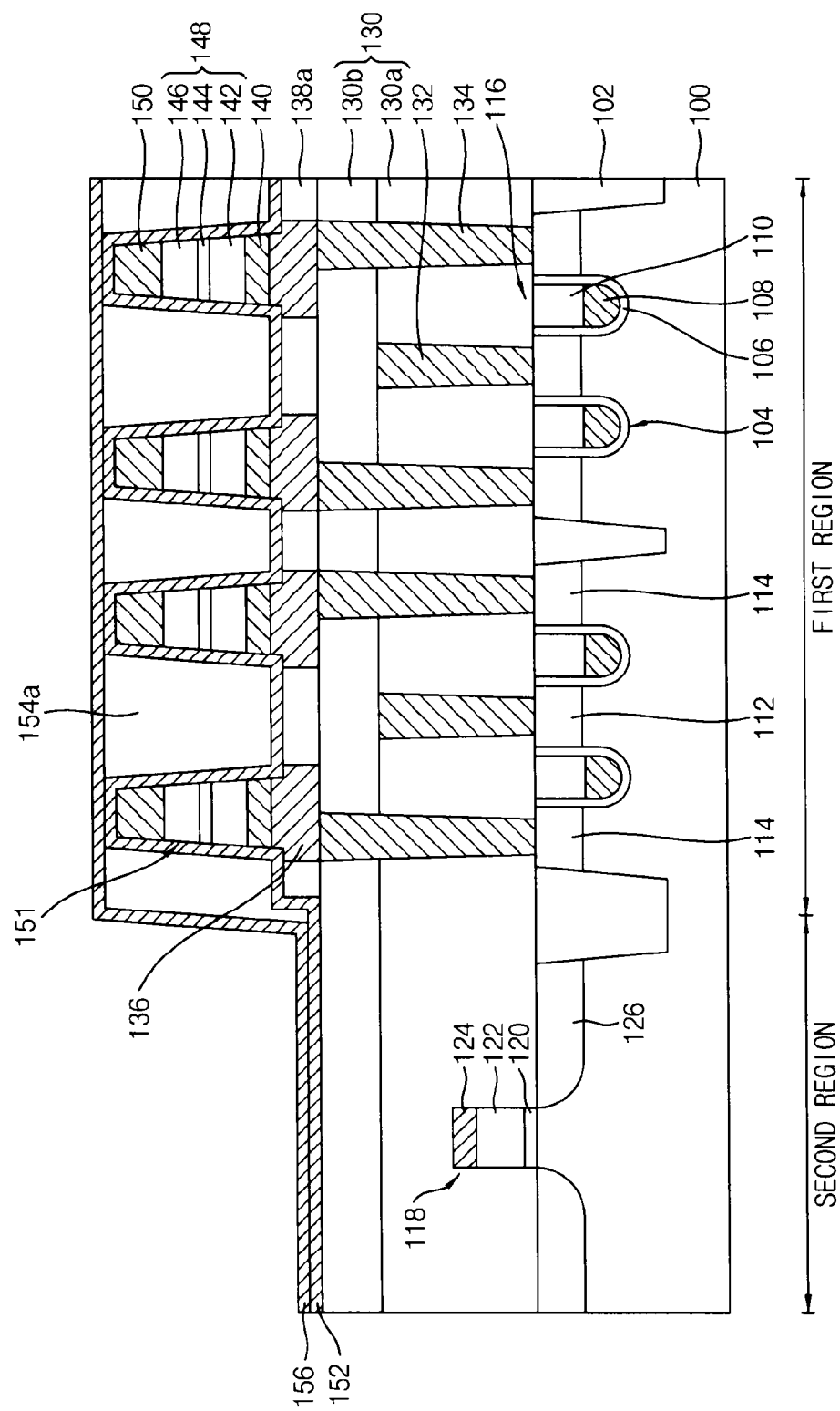

Referring to FIG. 19, a preliminary etch-stop layer 156 may be formed on the preliminary capping layer 152 on the first and second regions. That is, the preliminary capping layer 152 may not be etched by an etch-back process, so that the preliminary capping layer 152 may remain on the first and second regions. The preliminary etch-stop layer 156 may be conformally formed on the first and second regions. A first upper surface of a first portion of the preliminary etch-stop layer 156 on the first region may be higher than a second upper surface of a second portion of the preliminary etch-stop layer 156 on the second region. The preliminary etch-stop layer 156 may have substantially the same thickness on the first and second regions, and the first and second portions of the preliminary etch-stop layer 156 on the first and second regions, respectively, may have flat surfaces.

Figure 20:
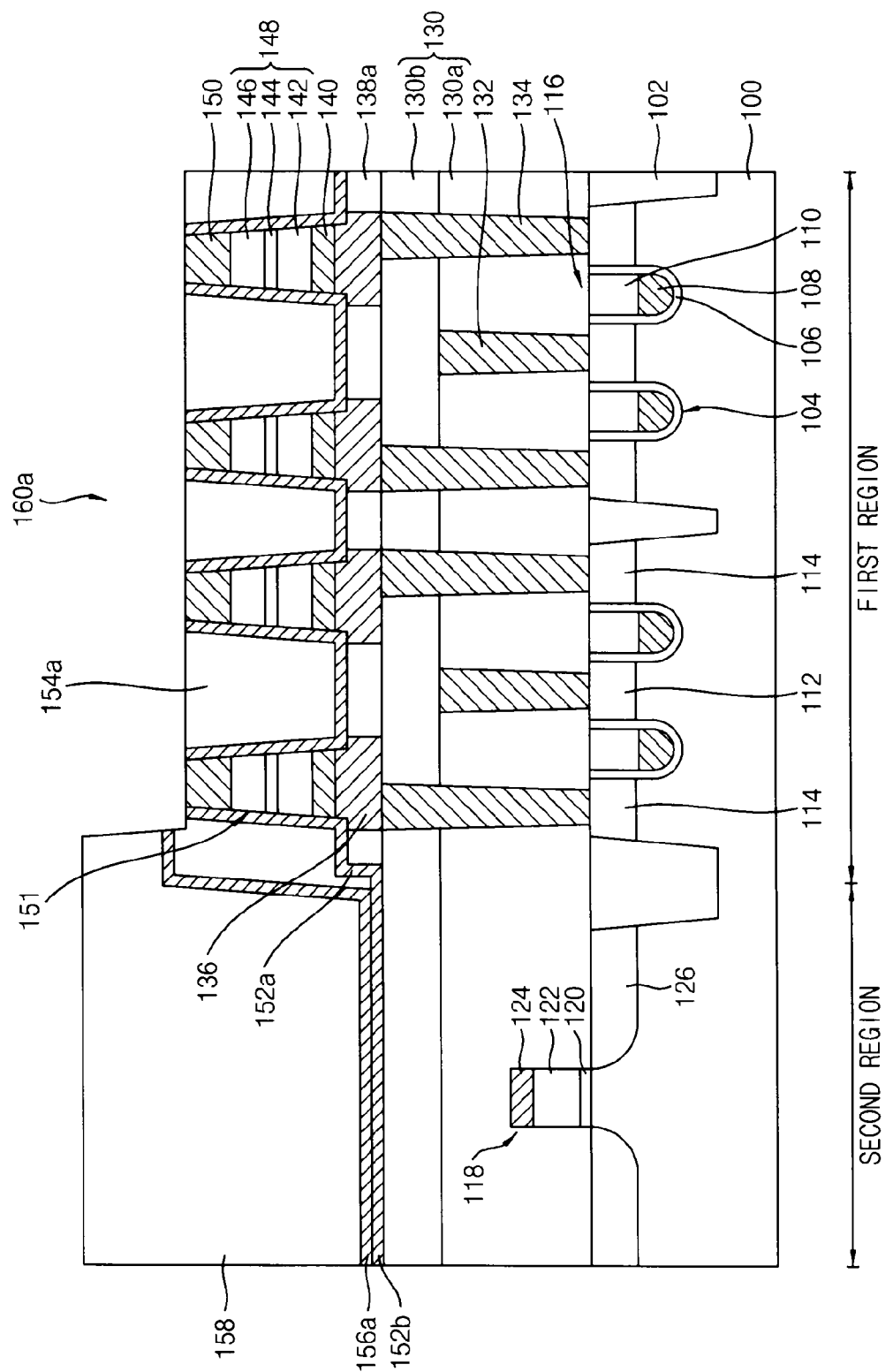

Referring to FIG. 20, a second insulating interlayer 158 may be formed on the preliminary etch-stop layer 156. The second insulating interlayer 158 may be planarized so that an upper surface of the second insulating interlayer 158 on the first and second regions may be flat.

A portion of the second insulating interlayer 158 on the first region may be partially etched until the first upper surface of the first portion of the preliminary etch-stop layer 156 may be exposed to form a preliminary trench (not shown). The preliminary etch-stop layer 156 in the preliminary trench may be etched to form a trench 160a, and an upper surface of the MTJ structures 151 may be exposed by the trench 160a. In the etching process, damages to the MTJ structures 151 may decrease, and each of the MTJ structures 151 may have a uniform thickness.

Figure 21:
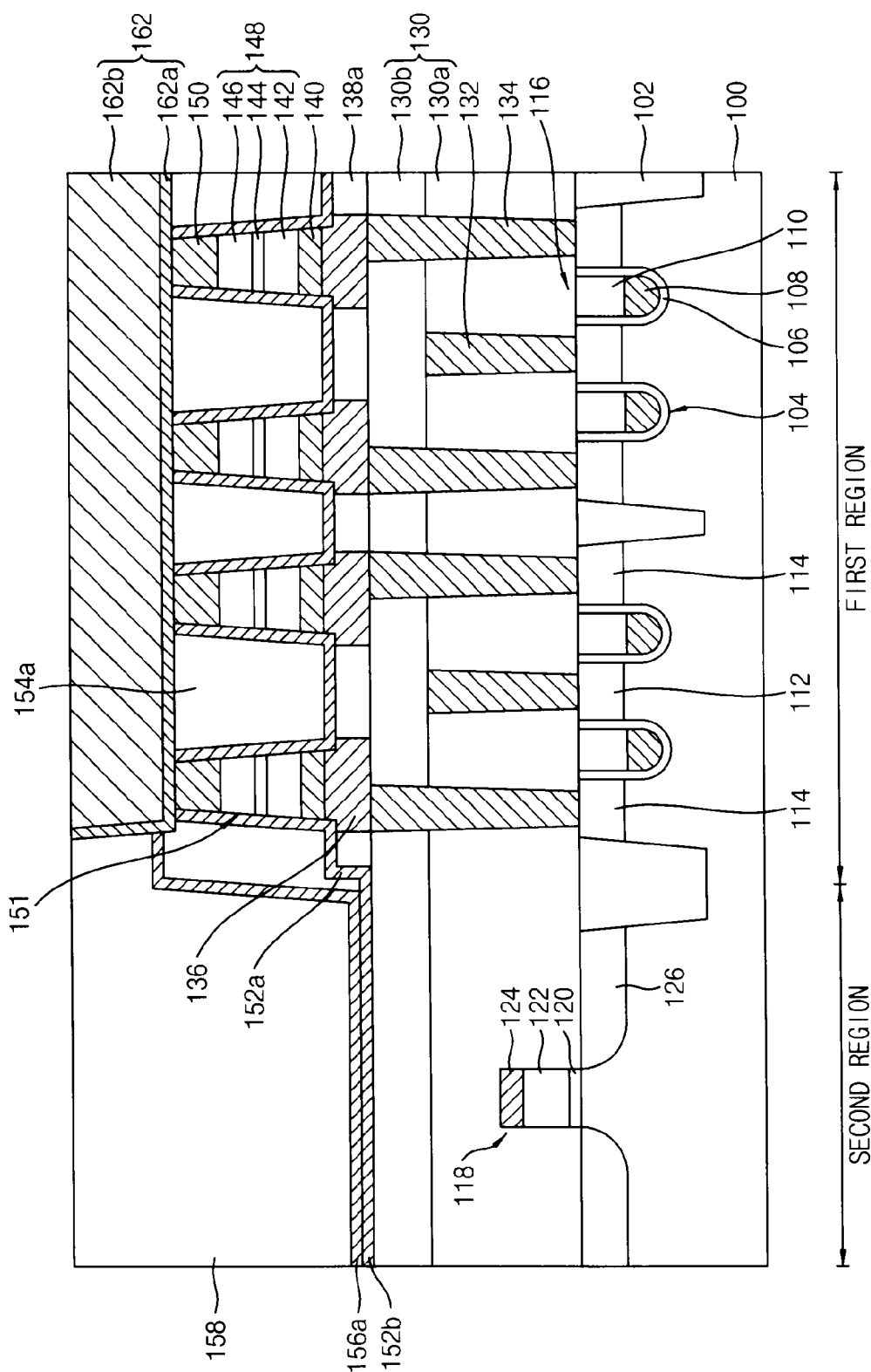

In example embodiments, a plurality of trenches 160a each of which may extend in the second direction may be formed, and may provide spaces for forming bit lines 162 (refer to FIG. 21).

Referring to FIG. 21, the bit lines 162 may be formed in the trenches 160a, respectively. Each of the bit lines 162 may be formed on the upper electrodes 150 of the MTJ structures 151. Each of the upper electrodes 150 may have a uniform thickness so that an MRAM device may have a reduced resistance distribution between each of the MTJ structures 151 and each of the bit lines 162.

As described above, the preliminary etch-stop layer 156 may have the flat upper surfaces and may be formed on the first region entirely. Also, the trenches 160a for forming the bit lines 162 may be formed by an etching process using the preliminary etch-stop layer 156 as an etch-stop layer. Thus, process failures for forming the bit lines 162 and the MTJ structures 151 may decrease.

Figure 22:
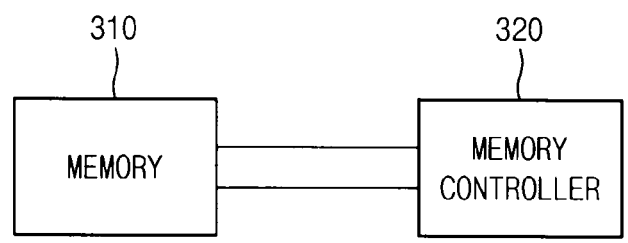

FIG. 22 is a block diagram illustrating a memory system in accordance with example embodiments.

Referring to FIG. 22, the memory system may include a memory controller 320 and a memory 310 connected to the memory controller 320. The memory 310 may include the MRAM device according to example embodiments. The memory controller 320 may provide a control signal for controlling the memory 310.

The MRAM device according to example embodiments may be used in various types of electronic devices, e.g., mobile devices, memory cards, computers, etc.

Figure 23:
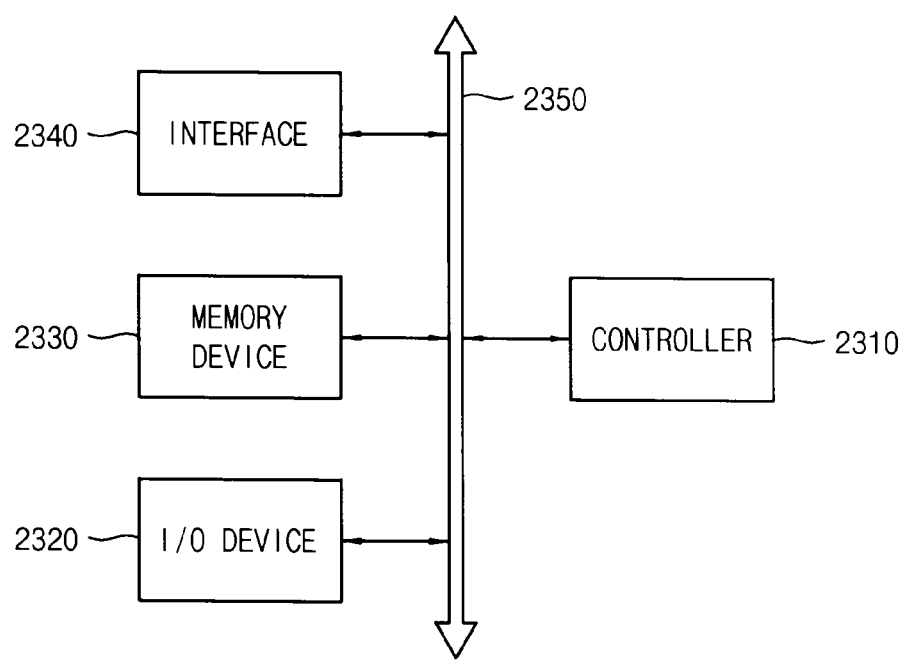
FIG. 23 is a block diagram of an electronic device that comprises an MRAM according to example embodiments.

Referring to FIG. 23, an electronic device 2300 including a semiconductor device according to example embodiments disclosed herein may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 2300 may include a controller 2310, an input/output device 2320 such as, but not limited to, a keypad, a keyboard, a display, or a touch-screen display, a memory 2330, and a wireless interface 2340 that are combined to each other through a bus 2350. The controller 2310 may include, for example, at least one microprocessor, a digital signal process, a microcontroller or the like. The memory 2330 may be configured to store a command code to be used by the controller 2310 or a user data. The memory 2330 may include a semiconductor device according to example embodiments of the inventive concept. The electronic device 2300 may use a wireless interface 2340 configured to transmit data to or receive data from a wireless communication network using a RF signal. The wireless interface 2340 may include, for example, an antenna, a wireless transceiver and so on. The electronic system 2300 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 24:
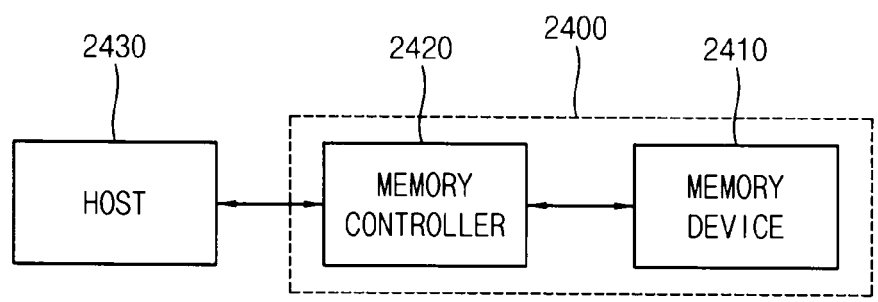
FIG. 24 is a block diagram of a memory system according to example embodiments.

Referring to FIG. 24, a memory system including a semiconductor device according to example embodiments disclosed herein will be described. The memory system 2400 may include a memory device 2410 for storing large amounts of data and a memory controller 2420. The memory controller 2420 controls the memory device 2410 to read data stored in the memory device 2410 or to write data into the memory device 2410 in response to a read/write request of a host 2430. The memory controller 2430 may include an address-mapping table for mapping an address provided from the host 2430 (e.g., a mobile device or a computer system) into a physical address of the memory device 2410. The memory device 2410 may be a semiconductor device according to example embodiments disclosed herein.

The semiconductor memory devices disclosed herein may be encapsulated using various and diverse packaging techniques. For example, the semiconductor memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above example embodiments is mounted may further include at least one semiconductor device (e.g., a controller and/or a logic device) that controls the semiconductor memory device. Additionally, the semiconductor memory devices disclosed herein may be part of a System on a Chip (SOC).

What is claimed is:

1. A magnetoresistive random access memory device, comprising:
    a first insulating interlayer on a first region and a second region of a substrate, the first insulating region comprising a flat first upper surface;
    a pattern structure comprising magnetic tunnel junction (MTJ) structures and a filling layer pattern between the MTJ structures on the first insulating interlayer over the first region, the pattern structure comprising a flat second upper surface higher than the first upper surface, and the MTJ structures comprising a pillar shape;
    bit lines on the pattern structure, and each of the bit lines contacting top surfaces of the MTJ structures;
    a capping layer pattern on a sidewall of each of the MTJ structures and the first insulating interlayer between the MTJ structures on the first region; and
    an etch-stop layer on the pattern structure between the bit lines on the first region and the first upper surface of the first insulating interlayer on the second region, a first portion of an upper surface of the etch-stop layer on the first region being higher than a second portion of the upper surface of the etch-stop layer on the second region.

2. The device of claim 1, wherein the capping layer pattern comprises silicon nitride or silicon oxynitride.

3. The device of claim 1, wherein the etch-stop layer is formed on the entire first upper surface of the first insulating interlayer on the second region, a sidewall of the filling layer at an interface between the first and second regions, and a portion of an upper surface of the filling layer.

4. The device of claim 1, wherein the etch-stop layer comprises silicon nitride, silicon oxynitride or aluminum oxide.

5. The device of claim 1, further comprising a second insulating interlayer on the etch-stop layer on the first and second regions, the second insulating interlayer filling gaps between the bit lines.

6. The device of claim 1, wherein the magnetoresistive random access memory device is part of a smartphone.

7. The device of claim 6, the smartphone comprises a touch-screen display.

8. The device of claim 1, further comprising a plurality of contact plugs, the contact plugs extending through the first insulating interlayer, wherein the contact plugs are electrically connected to the MTJ structures and the first region of the substrate.

9. The device of claim 8, further comprising a plurality of pad patterns, a pad pattern being on a respective contact plug, and wherein the pad patterns electrically connect the MTJ structures to the contact plugs.

10. A magnetoresistive random access memory device, comprising:
a lower structure having a flat first upper surface on a substrate;
a plurality of magnetic tunnel junction (MTJ) structures, each MTJ structure comprising a pillar shape on the lower structure;
a capping layer pattern on a sidewall of each of the MTJ structures and on the lower structure between the MTJ structures;
a filling layer pattern on the capping layer pattern, the filling layer filling gaps between the MTJ structures, and a top surface of the filling layer being substantially coplanar with top surfaces of the MTJ structures;
bit lines on the filling layer pattern and the MTJ structures, each of the bit lines contacting the top surfaces of the MTJ structures; and
an etch-stop layer on the filling layer pattern between the bit lines.

11. The device of claim 10, wherein the etch-stop layer has a flat upper surface.

12. The device of claim 10, wherein the etch-stop layer comprises silicon nitride, silicon oxynitride or aluminum oxide.

13. The device of claim 10, wherein the capping layer pattern comprises silicon nitride or silicon oxynitride.

14. The device of claim 10, wherein the magnetoresistive random access memory device is part of a smart phone comprising a touch-screen display.

15. A magnetoresistive random access memory device, comprising:
a first insulating interlayer on a first region and a second region of a substrate, the first insulating region comprising a flat first upper surface;
a pattern structure comprising magnetic tunnel junction (MTJ) structures and a filling layer pattern between the MTJ structures on the first insulating interlayer over the first region, the pattern structure comprising a flat second upper surface higher than the first upper surface, and the MTJ structures comprising a pillar shape;
bit lines on the pattern structure, and each of the bit lines contacting top surfaces of the MTJ structures;
an etch-stop layer on the pattern structure between the bit lines on the first region and the first upper surface of the first insulating interlayer on the second region, a first portion of an upper surface of the etch-stop layer on the first region being higher than a second portion of the upper surface of the etch-stop layer on the second region; and
a second insulating interlayer on the etch-stop layer on the first and second regions, the second insulating interlayer filling gaps between the bit lines.

16. The device of claim 15, further comprising a capping layer pattern on a sidewall of each of the MTJ structures and the first insulating interlayer between the MTJ structures on the first region.

17. The device of claim 16, wherein the capping layer pattern comprises silicon nitride or silicon oxynitride.

18. The device of claim 15, wherein the etch-stop layer is formed on the entire first upper surface of the first insulating interlayer on the second region, a sidewall of the filling layer at an interface between the first and second regions, and a portion of an upper surface of the filling layer, and
wherein the etch-stop layer comprises silicon nitride, silicon oxynitride or aluminum oxide.

19. The device of claim 10, wherein the magnetoresistive random access memory device is part of a smart phone comprising a touch-screen display.

* * * * *